(12) United States Patent
Fukugami et al.

(10) Patent No.: US 9,285,672 B2
(45) Date of Patent: Mar. 15, 2016

(54) REFLECTIVE MASK AND METHOD FOR MANUFACTURING SAME

(71) Applicant: TOPPAN PRINTING CO., LTD., Tokyo (JP)

(72) Inventors: Norihito Fukugami, Tokyo (JP); Yo Sakata, Tokyo (JP); Kazuaki Matsui, Tokyo (JP); Genta Watanabe, Tokyo (JP)

(73) Assignee: TOPPAN PRINTING CO., LTD., Tokyo (JP)

( * ) Notice: Subject to any disclaimer, the term of this patent is extended or adjusted under 35 U.S.C. 154(b) by 194 days.

(21) Appl. No.: 14/187,885

(22) Filed: Feb. 24, 2014

(65) Prior Publication Data

US 2014/0170536 A1   Jun. 19, 2014

Related U.S. Application Data

(63) Continuation of application No. PCT/JP2012/005309, filed on Aug. 24, 2012.

(30) Foreign Application Priority Data

Aug. 25, 2011 (JP) ................................. 2011-184186
Sep. 28, 2011 (JP) ................................. 2011-213242
Sep. 28, 2011 (JP) ................................. 2011-213243

(51) Int. Cl.
   *G03F 1/24* (2012.01)
   *G03F 1/38* (2012.01)
   *B82Y 10/00* (2011.01)
   *B82Y 40/00* (2011.01)

(52) U.S. Cl.
   CPC . *G03F 1/24* (2013.01); *B82Y 10/00* (2013.01); *B82Y 40/00* (2013.01); *G03F 1/38* (2013.01)

(58) Field of Classification Search
   CPC ..................................... G03F 1/24; G03F 1/22
   USPC ............................................................... 430/5
   See application file for complete search history.

(56) References Cited

U.S. PATENT DOCUMENTS

| 5,485,497 | A | 1/1996 | Oizumi et al. |
| 2003/0173529 | A1 | 9/2003 | Hoshino |
| 2009/0220869 | A1 | 9/2009 | Takai |
| 2010/0167186 | A1 | 7/2010 | Jang et al. |
| 2012/0045712 | A1* | 2/2012 | Chang ........................ G03F 1/24 430/5 |

FOREIGN PATENT DOCUMENTS

| CN | 101393387 | 3/2009 |
| JP | 6-120125 | 4/1994 |
| JP | 2002-353123 | 12/2002 |
| JP | 2003-270773 | 9/2003 |
| JP | 2009-147200 | 7/2009 |
| JP | 2009-212220 | 9/2009 |
| JP | 2010-141338 | 6/2010 |
| JP | 2011-151202 | 8/2011 |
| JP | 2011-176127 | 9/2011 |

OTHER PUBLICATIONS

International Search Report mailed Sep. 18, 2012, in corresponding International Application No. PCT/JP2012/005309.

* cited by examiner

*Primary Examiner* — Stephen Rosasco

(57) ABSTRACT

A reflective mask having a light-shielding frame with high light-shielding performance, and a method for manufacturing thereof. In a reflective mask having a light-shielding frame dug into a multilayered reflective layer, when side etching is performed or processing to obtain a reverse tapered shape is performed only on the multilayered reflective layer, it becomes possible to suppress reflection of EUV light (extreme ultraviolet light) in the vicinity of the edge of the light-shielding frame, provide a reflective mask having high light-shielding ability, and form a transcription pattern with high accuracy.

19 Claims, 23 Drawing Sheets

FIG. 14
(a)
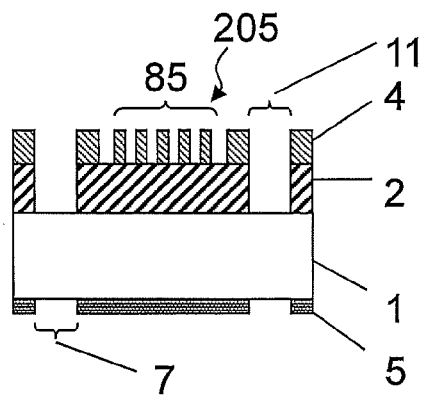
(b)
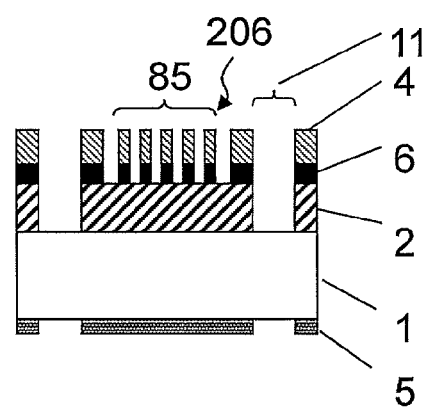
(c)
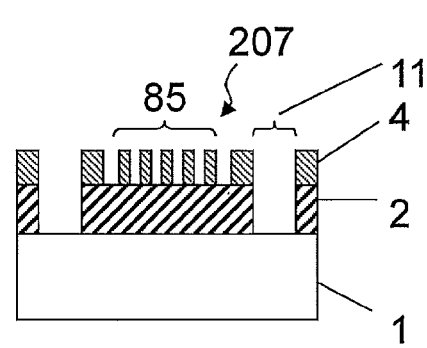
(d)
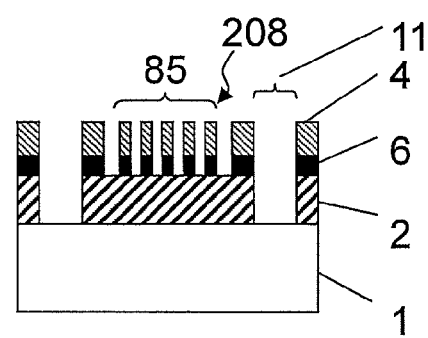

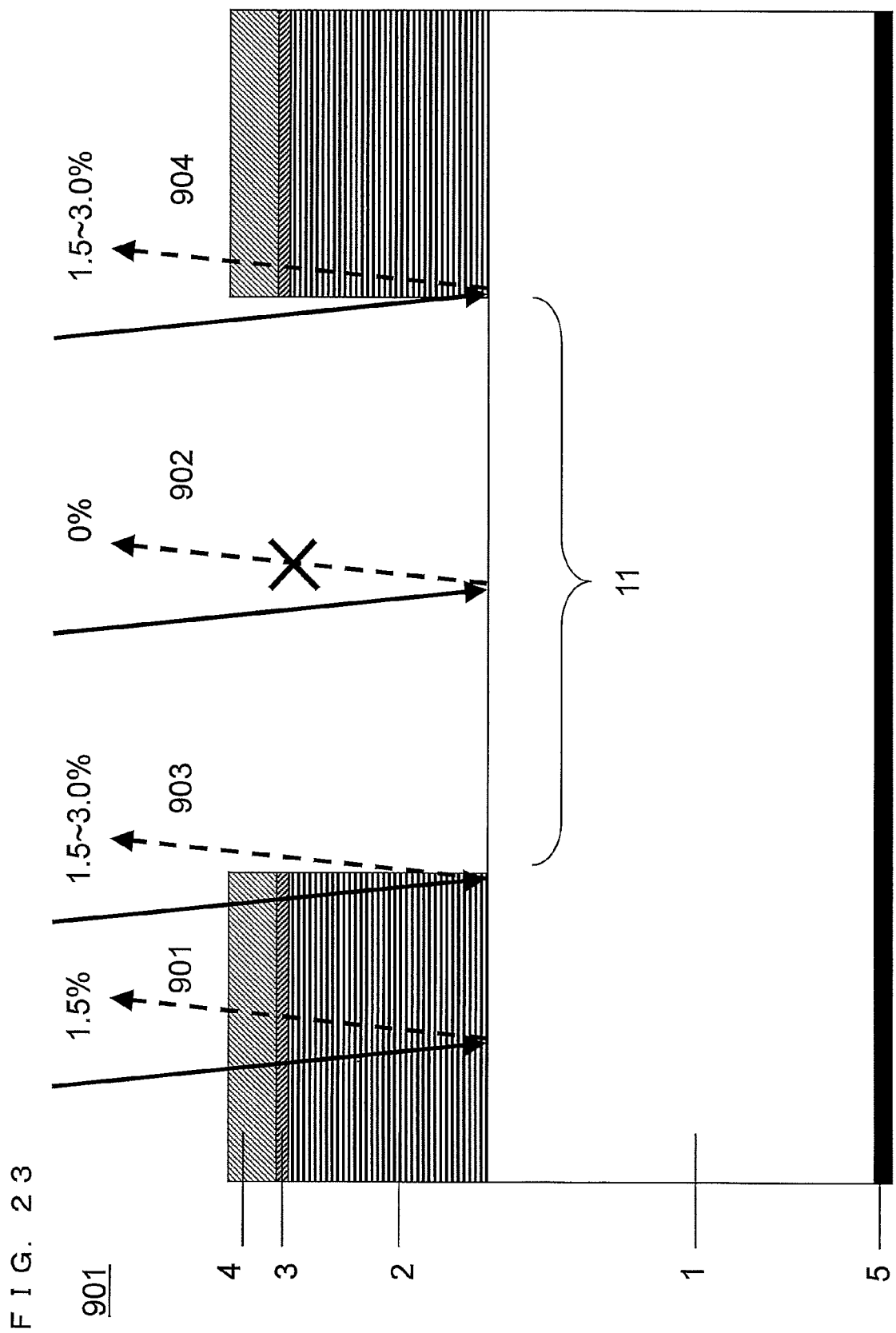

REFLECTIVE MASK AND METHOD FOR MANUFACTURING SAME

CROSS-REFERENCE TO RELATED APPLICATIONS

This application is a U.S. continuation application filed under 35 U.S.C. §111 (a), of International Application No. PCT/JP2012/005309, filed on Aug. 24, 2012, which claims priority to Japanese Patent Application No. 2011-184186, filed Aug. 25, 2011, Japanese Patent Application No. 2011-213242, filed Sep. 28, 2011, and Japanese Patent Application No. 2011-213243, filed Sep. 28, 2011, the disclosures of which are incorporated by reference.

BACKGROUND

1. Field

The present invention relates to a reflective mask and a method for manufacturing the reflective mask; and, in particular, relates to a reflective mask utilized in a semiconductor fabrication device using EUV lithography whose light source is extreme ultraviolet ray (hereinafter, represented as "EUV"), and a method for manufacturing the reflective mask.

2. Description of the Related Art

Description of EUV Lithography

Associated with miniaturization of semiconductor devices, the demand of miniaturization has increased for photolithography technique. As a part of realizing miniaturization with photolithography technique, replacement is already being made in the exposure method of lithography, from exposure using conventional ArF excimer laser light having a wavelength of 193 nm to exposure using light in the EUV range with a wavelength of 13.5 nm. EUV lithography has to be performed in vacuum since the wavelength of a light source is short and the light absorption property is very high with EUV lithography. In addition, the refractive indices of most substances are values slightly smaller than 1 in the wavelength range of EUV. Therefore, the conventionally used transmission type dioptric system cannot be used in EUV lithography, and a catoptric system is used. Thus, it is necessary to use a reflective mask as a photomask (hereinafter, referred to as mask) that becomes the master copy, since the conventional transmissive mask cannot be used.

Description of Reflective Mask and Blank Structure

Such a reflective mask is created based on a substrate referred to as a reflective mask blank. The reflective mask blank is obtained by, sequentially forming, on a low thermal-expansion substrate, a multilayered reflective layer having high reflectance against the wavelength of a exposure light source, and an absorption layer configured to absorb the wavelength of the exposure light source, and further forming, on the reverse surface of the substrate, a reverse-surface conductive film for electrostatic chuck fixing in an exposure machine. There are also reflective masks with a structure having a buffer layer between the multilayered reflective layer and the absorption layer. When processing the reflective mask blank into a reflective mask, the absorption layer is partially stripped together with a buffer layer if the structure has a buffer layer, using EB lithography and etching technology to form a circuit pattern consisting of absorption parts and reflective parts. Optical images reflected by the reflective mask produced in such manner are transcribed onto a semiconductor substrate via a catoptric system.

Description of Reflectance and Film Thickness of Absorption Layer of Reflective Mask With an exposure method using the catoptric system, deflection using a transmissive beam splitter is not possible. Therefore, the reflective mask has a disadvantage of being unable to design incident light to the mask and reflected light therefrom to be on the same axis, and since incident light is emitted at an incidence angle (ordinarily 6°) inclined by a predetermined angle from a perpendicular direction with respect to the mask surface, a shadow of a pattern itself is generated when the film thickness of the absorption layer is large. Since the reflection intensity at the shadowed part is smaller than a part that is not shadowed, a reduced contrast is obtained, resulting in a transcription pattern having blurred edge parts and deviation from a designed size. This is referred to as shadowing, and is a fundamental problem for reflective masks.

In order to prevent blurred edge parts of the pattern and deviation from the designed size, reducing the film thickness of the absorption layer and lowering the height of the pattern are effective. However, reducing the film thickness of the absorption layer film results in deterioration in the light-shielding ability at the absorption layer, reduction in transcription contrast, and deterioration in accuracy of the transcription pattern. If the absorption layer is too thin, the contrast necessary to maintain accuracy of the transcription pattern cannot be obtained.

As described above, since it becomes a problem if the film thickness of the absorption layer is too large or too small, the film thickness at present is generally set between 50 to 90 nm, and the reflectance of EUV light (extreme ultraviolet light) at the absorption layer is about 0.5 to 2%.

Description of Multiple Exposures of Adjacent Chips

On the other hand, when forming a transcription circuit pattern on a semiconductor substrate such as a silicon wafer using a reflective mask, chips with multiple circuit patterns are formed on a single semiconductor substrate. In some cases, there is an overlapping area of chip outer circumferential portions of adjacent chips. This is due to chips being arranged in high density for the purpose of improving productivity based on an intention of increasing the number of chips that can be obtained from a single wafer. In this case, the overlapping area of the chip outer circumferential portions is exposed for multiple times (at maximum, four times) (multiple exposures). The chip outer circumferential portions of the transcription pattern correspond to outer circumferential portions of the reflective mask, and the outer circumferential portions of the reflective mask are portions where an absorption layer is formed, ordinarily. However, as described above, since the reflectance of EUV light at the absorption layer is about 0.5 to 2%, there has been a problem of the chip outer circumferential portions being sensitized due to multiple exposures. Therefore, it has become necessary to provide, at the chip outer circumferential portion on the mask, an area (hereinafter, referred to as a light-shielding frame) that has a higher shielding ability against EUV light than an ordinary absorption layer and that has a reflectance of 0.3% or lower.

In order to solve such a problem, reflective masks having a light-shielding frame with high light-shielding ability against exposure light source wavelengths are proposed, including a reflective mask having formed therein a trench that is dug from an absorption layer into a multilayered reflective layer of the reflective mask, a reflective mask having formed therein a film that has a larger film thickness than an absorption film at a circuit pattern area, and a reflective mask in which reflectance of a multilayered reflective layer is reduced by laser irradiation or ion implantation on the reflective mask (e.g., Patent Literature 1).

Citation List

[PTL 1] Japanese Laid-Open Patent Publication No. 2009-212220

SUMMARY

However, the light-shielding frame, disclosed in Patent Literature 1 described above, simply having dug therein an absorption layer and a multilayered reflective layer has the following problem. This will be described in detail using a figure. FIG. 12 shows an outline cross sectional view of a conventional reflective mask 901. Although EUV reflectance can be reduced almost to zero at a large portion of a light-shielding frame 11 shown in FIG. 23, there is a problem where EUV reflectance (903, 904) in the vicinity of the edge of the light-shielding frame becomes even higher than before the light-shielding frame is formed. This is because, since an absorption layer 4 that had contributed to the reduction of EUV reflectance also has to be stripped with the method of simply digging into a multilayered reflective layer 2, there are cases where EUV light passes through the absorption layer 4 only once during the processes of incidence and reflection at the vicinity of the edge of the light-shielding frame. For example, EUV light that has diagonally entered from a side of the light-shielding frame area may enter a lateral wall of the multilayered reflective layer without passing through the absorption layer, and the EUV light reflected at the multilayered reflective layer may leak out to a side of a wafer while passing through the absorption layer only once (904 in FIG. 23). Alternatively, EUV light that has entered diagonally may pass through the absorption layer first. However, at the vicinity of the edge of the light-shielding frame, one part of the EUV light reflected at the multilayered reflective layer may exit the lateral wall of the multilayered reflective layer and leak out on the wafer side (903 in FIG. 23). Thus, because of the light-shielding frame 11 for reducing EUV reflectance, leakage of reflected EUV light occurs at the edge portion of the light-shielding frame, causing a problem of increased EUV reflectance and reduced light-shielding performance.

In addition, with multiple exposures, there has been a problem of the chip outer circumferential portion being sensitized not only through exposure with EUV light, but also similarly with light other than that of the 13.5 nm band, from vacuum ultraviolet ray range to near infrared ray range referred to as Out of Band light (hereinafter, OoB (Out of Band) light). Such OoB light is reflected at the EUV absorption layer (in which substances containing tantalum (Ta) are used abundantly as a main material) in the mask, and is radiated to the wafer. Therefore, light with various wavelengths other than that of 13.5 nm are emitted on the resist on the wafer to cause sensitization, leading to adverse influences such as deviation of pattern dimension in the vicinity of the chip boundary area.

However, in the method disclosed in Patent Literature 1 described above, since it is necessary to process a total of 80 layers of different materials of molybdenum (Mo) and silicon (Si) in the dug-in portion of the multilayered reflective layer at the area of the light-shielding frame after creating a mask pattern, the conditions for achieving dry etching has been very complicated. In addition, apart from etching of the main pattern, since lithography and etching have to be performed in two separate steps, inconvenience of worsened throughput occurs.

Furthermore, in the method disclosed in Patent Literature 1 described above, a conductive film is disposed on the reverse surface of the substrate even when the light-shielding frame is formed after digging and stripping all of the absorption layer and the multilayered reflective layer to expose the substrate surface. Since substances containing chromium (Cr) is abundantly used in the conductive film as main materials, OoB light that has entered from the mask surface passes through the substrate, is reflected at the reverse surface of the conductive film, passes through the substrate again, and returns to the mask surface, causing an inconvenience of having an adverse influence.

Furthermore, when Si and Mo are alternately disposed as a set in a layer, 40 layers have to be processed with the digging of the multilayered reflective layer after creating the mask pattern. Since the multilayered reflective layer is stripped after stripping of the absorption layer which is the upper layer, having the multilayered reflective layer remaining by as less as several layers raises concern of the reflectance becoming not low but high.

When the light-shielding frame is formed on the reflective mask through laser irradiation or ion implantation, since there is loss of laser light or ion due to other than the multilayer reflective film, the laser light or ion has to be emitted while taking into consideration this amount of loss. Furthermore, in layers other than the multilayered reflective layer, there is a concern of reduced absorption factor in the exposure light source wavelength of the absorption layer as a result of damage caused by the irradiation using the laser light or ion.

The present invention has been made in view of the above described problems, and an objective of the present invention is to provide a reflective mask having a light-shielding frame with high light-shielding performance, and a method for manufacturing thereof.

Furthermore, an objective of the present invention is to provide a reflective mask that has a light-shielding frame for lessening the influence of OoB light and that is easy to manufacture, and a method for manufacturing the reflective mask.

In addition, an objective of the present invention is to provide a reflective mask that has high light-shielding ability and that is easy to manufacture without having any remaining multilayer reflective films, and a method for manufacturing the reflective mask.

Solution to the Problems

The present invention is a reflective mask that includes: a substrate; a multilayered reflective layer formed on one surface of the substrate; a protective layer formed on the multilayered reflective layer; and an absorption layer formed on the protective layer. At least one part of an outer side of a circuit pattern area formed on the absorption layer has a light-shielding frame that is formed through stripping of the absorption layer, the protective layer, and the multilayered reflective layer. An opening width of the multilayered reflective layer within the light-shielding frame is wider than an opening width of the absorption layer located above thereof.

Furthermore, the present invention is a method for manufacturing a reflective mask, in which the method includes: forming a multilayered reflective layer on one surface of a substrate; forming a protective layer on the multilayered reflective layer; forming an absorption layer on the protective layer; forming a circuit pattern on the reflective layer; and forming a light-shielding frame through stripping, with dry etching or wet etching, of the multilayered reflective layer, the protective layer, and the absorption layer in a frame-shaped area on an outer side of the circuit pattern until one surface of the substrate is exposed, such that an opening width of the multilayered reflective layer is wider than an opening width of the absorption layer located above thereof.

Furthermore, in the method for manufacturing the reflective mask described above, at the forming of the multilayered reflective layer on one surface of the substrate, a sacrificial film is formed with an Al film, or a nitride film (SiN) or an oxide film (SiO) whose main component is silicon (Si) on one part of the substrate formed with a material containing quartz ($SiO_2$) as a main component and titanium oxide ($TiO_2$), and, then, the multilayered reflective layer that reflects exposure light is formed on the substrate in a multilayer structure having multiple layers of materials of molybdenum (Mo) and silicon (Si) layered alternately. At the forming of the absorption layer, the absorption layer absorbing the exposure light is formed on the multilayered reflective layer, in a monolayer structure formed with a material containing any one of tantalum (Ta) and an oxide, a nitride, or an oxynitride thereof, or in a laminated structure in which a material containing any one of tantalum (Ta) and an oxide, a nitride, or an oxynitride thereof is laminated, and a material containing any one of and an oxide, a nitride, or an oxynitride of tantalum (Ta), or an oxide, a nitride, or an oxynitride of silicon (Si) is laminated on an uppermost layer. At the forming of the light-shielding frame, the light-shielding frame is disposed on an area where the sacrificial film is formed.

Advantageous Effects

With the present invention, since it is possible to, in an EUV mask having formed thereon a light-shielding frame through stripping of a multilayered reflective layer, reduce reflection of EUV light in the vicinity of the edge of the light-shielding frame to almost zero, a reflective mask having high light-shielding performance and a method for manufacturing the reflective mask can be provided. Thus, an advantageous effect of being able to form transcription patterns with high accuracy can be obtained. In addition, it is possible to provide a reflective mask that has a light-shielding frame for lessening the influence of OoB light and that is easy to manufacture, and a method for manufacturing the reflective mask. Furthermore, it is possible to provide a reflective mask that has high light-shielding ability and does not have any remaining multilayer reflective films, and a method for manufacturing the reflective mask.

BRIEF DESCRIPTION OF THE DRAWINGS

These and/or other aspects and advantages will become apparent and more readily appreciated from the following description of the embodiments, taken in conjunction with the accompanying drawings of which:

FIG. 14 includes outline cross sectional views showing structures of the reflective masks according to the second embodiment of the present invention.

FIG. 23 is an outline cross sectional view showing a problem of a light-shielding frame structure of a conventional reflective mask.

DESCRIPTION OF EMBODIMENTS

First Embodiment

In the following, a first embodiment of the present invention will be described with reference to the drawings.

<Configuration of Reflective Mask>

Figure 1:
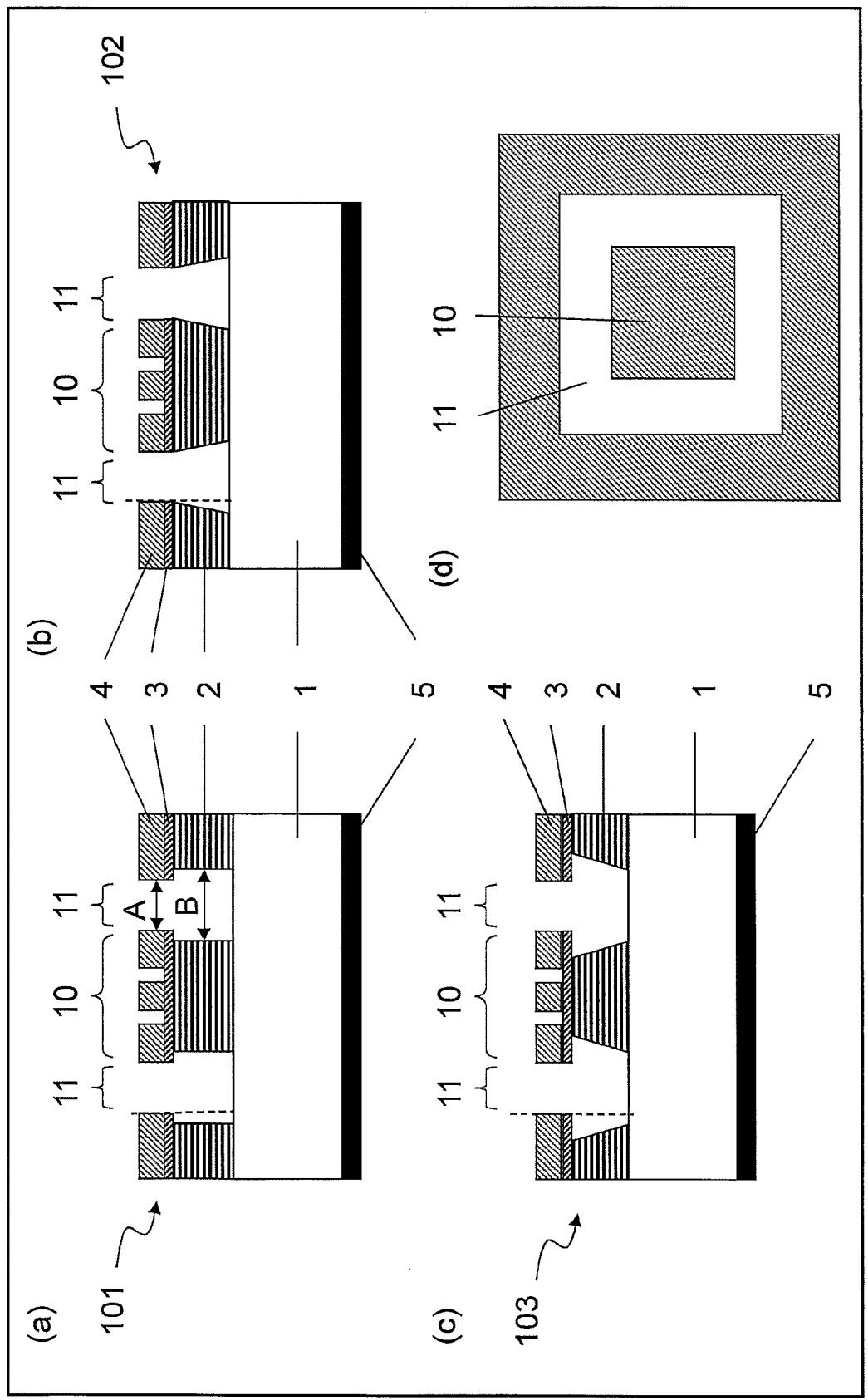
FIG. 1 includes outline cross sectional views and an outline plan view of structures of reflective masks according to a first embodiment of the present invention.

First, the configuration of reflective masks of the present invention will be described. In FIG. 1, (a), (b), and (c) are outline cross sectional views of structures of the reflective masks of the present invention, and (d) of FIG. 1 is an outline plan (a), (b), and (c) of FIG. 1 viewed from above. Thus the configuration of a reflective mask of the present embodiment may be any of 101, 102, and 103.

In reflective masks 101, 102, and 103 shown in (a), (b), and (c) of FIG. 1, a multilayered reflective layer 2, a protective layer 3, and an absorption layer 4 are sequentially formed on a surface of a substrate 1. The structure is such that a conductive film 5 is formed on the reverse surface of the substrate. A buffer layer may be included between the protective layer 3 and the absorption layer 4. The buffer layer is a layer provided for not damaging the protective layer 3, which is the foundation, when correcting a mask pattern of the absorption layer 4.

The reflective masks 101, 102, and 103 include a pattern area 10 in which the absorption layer 4 is processed, and, for example, at least at one part of an outer circumferential portion thereof, a light-shielding frame 11 in which the absorption layer 4, the protective layer 3, and the multilayered reflective layer 2 (and the buffer layer when the buffer layer exists) are partially stripped.

As shown in (a) of FIG. 1, in the reflective mask 101, an opening width of the multilayered reflective layer 2 within the light-shielding frame 11 is set to be wider than an opening width of the absorption layer 4 located above thereof by at least 21% of the film thickness of the multilayered reflective layer 2. Here, 21% of the film thickness of the multilayered reflective layer 2 refers to $2 \times \tan(6 \text{ degrees}) \times$ film thickness of the multilayered reflective layer. For example, in a case of film thickness of 280 nm which is most common in a multilayered reflective layer, it is sufficient when an opening width B of the multilayered reflective layer 2 is wider than an opening width A of the absorption layer 4 by at least 280 nm$\times 0.21 = 58.8$ nm.

Here, incidence angle $\theta$ (an angle formed between a traveling direction of light and a direction perpendicular to a reflective mask surface) of EUV light for EUV exposure is assumed to be within 6 degrees. However, even when the incidence angle $\theta$ of EUV light is equal to or larger than 6 degrees, the opening width of the multilayered reflective layer 2 can be determined by calculating the value of $2 \times \tan \theta \times$ film thickness of the multilayered reflective layer as described above in accordance with the incidence angle $\theta$ of EUV light, and setting the opening width of the multilayered reflective layer 2 to be equal to or larger than the opening width of the absorption layer 4 by this value.

In addition, in the reflective mask 102 as shown in (b) of FIG. 1, the multilayered reflective layer 2 has a shape with a lateral wall angle being reverse tapered (the width of the multilayered reflective layer 2 becomes smaller toward the substrate (lower part of the mask)) by −6 degrees or more.

Furthermore, in the reflective mask 103 as shown in (c) of FIG. 1, the multilayered reflective layer 2 has a forward tapered shape (the width of the multilayered reflective layer 2 becomes smaller toward the absorption film (upper part of the mask)). The shapes are not limited to those described above, and a bowing shape (a shape having roundness observed often with isotropic etching) may be used, as long as the opening width at a hem part (a part in contact with the substrate 1) of the multilayered reflective layer 2 is wider by at least 21% of the film thickness of the multilayered reflective layer 2.

With a structure each of the reflective masks 101, 102, and 103, leakage of reflected EUV light will not occur in the vicinity of the edge of the light-shielding frame with EUV exposure at an incidence of 6 degrees. The specified values of the opening width of at 21% or larger of the film thickness and the reverse tapered shape of −6 degrees are values confirmed that leakage of reflected EUV light will not occur through experiments.

<Details of Configuration of Reflective Mask: Multilayered Reflective Layer, Protective Layer, and Buffer Layer>

The multilayered reflective layer 2 shown in (a), (b), and (c) of FIG. 1 is designed so as to be able to achieve reflectance of about 60% with respect to EUV light, and is a lamination film obtained through alternately laminating, as a pair, 40 to 50 layers of Mo and Si. The protective layer 3 at the very top is formed from ruthenium (Ru) with a thickness of 2 to 3 nm or silicon (Si) with a thickness of about 10 nm. The layer adjacent below the Ru layer is a Si layer. The reason Mo and Si are used is because reflectance at the interface of Si and Mo can be set high, since Mo and Si have small absorption (extinction coefficient) against EUV light and the refractive index difference between Mo and Si for EUV light is large. When the protective layer 3 is Ru, the protective layer 3 plays a role as a protective layer against chemicals used during rinsing of the mask and a role as a stopper during processing of the absorption layer 4. When the protective layer 3 is Si, a buffer layer may exist at an interval with the absorption layer 4. The buffer layer is provided for protecting, when pattern-correcting or etching the absorption layer 4, the Si layer which is the uppermost layer of the multilayered reflective layer 2 adjacent below the buffer layer, and is formed from a nitride (CrN) of chromium (Cr).

<Details of Configuration of Reflective Mask: Absorption Layer>

The absorption layer 4 in (a), (b), and (c) of FIG. 1 is formed from a nitride (TaN) of tantalum (Ta) having high absorption factor with respect to EUV. Other materials that may be used include tantalum boron nitride (TaBN), tantalum silicon (TaSi), tantalum (Ta), and oxides thereof (TaBON, TaSiO, TaO).

The absorption layer 4 in (a), (b), and (c) of FIG. 1 may be an absorption layer formed of a two-layer structure having, as an upper layer, a low reflective layer with an antireflection function against ultraviolet light having a wavelength of 190 to 260 nm. The low reflective layer is provided for improving inspectability by increasing contrast with respect to inspection wavelength of a mask defect inspection machine.

<Details of Configuration of Reflective Mask: Conductive Film>

Although the conductive film 5 in (a), (b), and (c) of FIG. 1 is generally formed from CrN, the conductive film 5 may be formed from any material consisting of a metallic material as long as the material is electrically conductive. Although a mode in which the conductive film 5 is included is described in (a), (b), and (c) of FIG. 1, a mask blank and a mask not having the conductive film 5 may also be used.

<Details of Configuration of Reflective Mask: Digging into Multilayered Reflective Layer>

The method for forming the light-shielding frame of the reflective mask of the present invention will be described. First, a resist pattern whose opening is only the light-shielding frame part is formed through photolithography or electron-beam lithography. Next, the absorption layer 4 and the protective layer 3 are stripped at the opening part of the resist pattern through dry etching using fluorine-based or chlorine-based gas (or both). Then, the multilayered reflective layer 2 is penetrated and stripped by performing dry etching using a fluorine-based gas or wet etching using an alkaline solution or an acidic solution on the multilayered reflective layer 2.

The reason why a fluorine-based gas is used when penetrating and stripping the multilayered reflective layer 2 through dry etching is because a fluorine-based gas can perform etching on both Mo and Si which are materials of the multilayered reflective layer 2. Examples of fluorine-based gases that can be used in this case include $CF_4$, $C_2F_6$, $C_4F_8$, $C_5F_8$, $CHF_3$, $SF_6$, and $ClF_3$.

When penetrating and stripping the multilayered reflective layer 2 through wet etching, the etching liquid has to be suitable for etching Mo and Si which are the materials of the multilayered reflective layer. For example, TMAH (tetramethylammonium hydroxide), KOH (potassium hydroxide), and EDP (ethylenediamine pyrocatechol) are suitable as the alkaline solution. As the acidic solution, although a mixture of nitric acid and phosphoric acid is suitable, fluoric acid, sulfuric acid, or acetic acid may be added thereto.

It is possible to form respective shapes of the lateral walls of the multilayered reflective layer 2 in the process of penetrating and stripping the multilayered reflective layer 2. However, a dry etching process or a wet etching process for giving respective shapes of the lateral walls of the multilayered reflective layer may be added separately after the process of penetrating and stripping the multilayered reflective layer 2.

In the reflective masks 101, 102, and 103 of the present embodiment, pattern formation of the pattern area 10 may be performed after forming the light-shielding frame or before forming the light-shielding frame.

In the manner described above, since it is possible to, in an EUV mask having formed thereon a light-shielding frame through stripping of a multilayered reflective layer, reduce reflection of EUV light in the vicinity of the edge of the light-shielding frame to almost zero, a reflective mask having high light-shielding performance can be obtained.

Example 1-1

In the following, a first Example of the method for manufacturing the reflective mask of the present embodiment will be described. First, a reflective mask blank 100 in (a) of FIG. 2 was prepared. The reflective mask blank 100 was formed by sequentially forming, on the substrate 1, the multilayered reflective layer 2 including 40 pairs of Mo and Si and designed such that reflectance against EUV light with a wavelength of 13.5 nm is about 64%, the protective layer 3 of Ru having a thickness of 2.5 nm on the multilayered reflective layer 2, and the absorption layer 4 formed from TaSi having a thickness of 70 nm on the protective layer 3.

With respect to the reflective mask blank 100, a positive type chemically amplified resist 9 (FEP171: FUJIFILM Electronic Materials) was applied at a film thickness of 300 nm ((b) of FIG. 2), drawing was performed using an electron-beam lithography machine (JBX9000: JEOL Ltd.), post-exposure bake (Post Exposure Bake: PEB) was performed for 10 minutes at 110° C., and spray development (SFG3000: Sigmameltec ltd.) was performed to form a resist pattern in the resist portion ((c) of FIG. 2).

Figure 2:
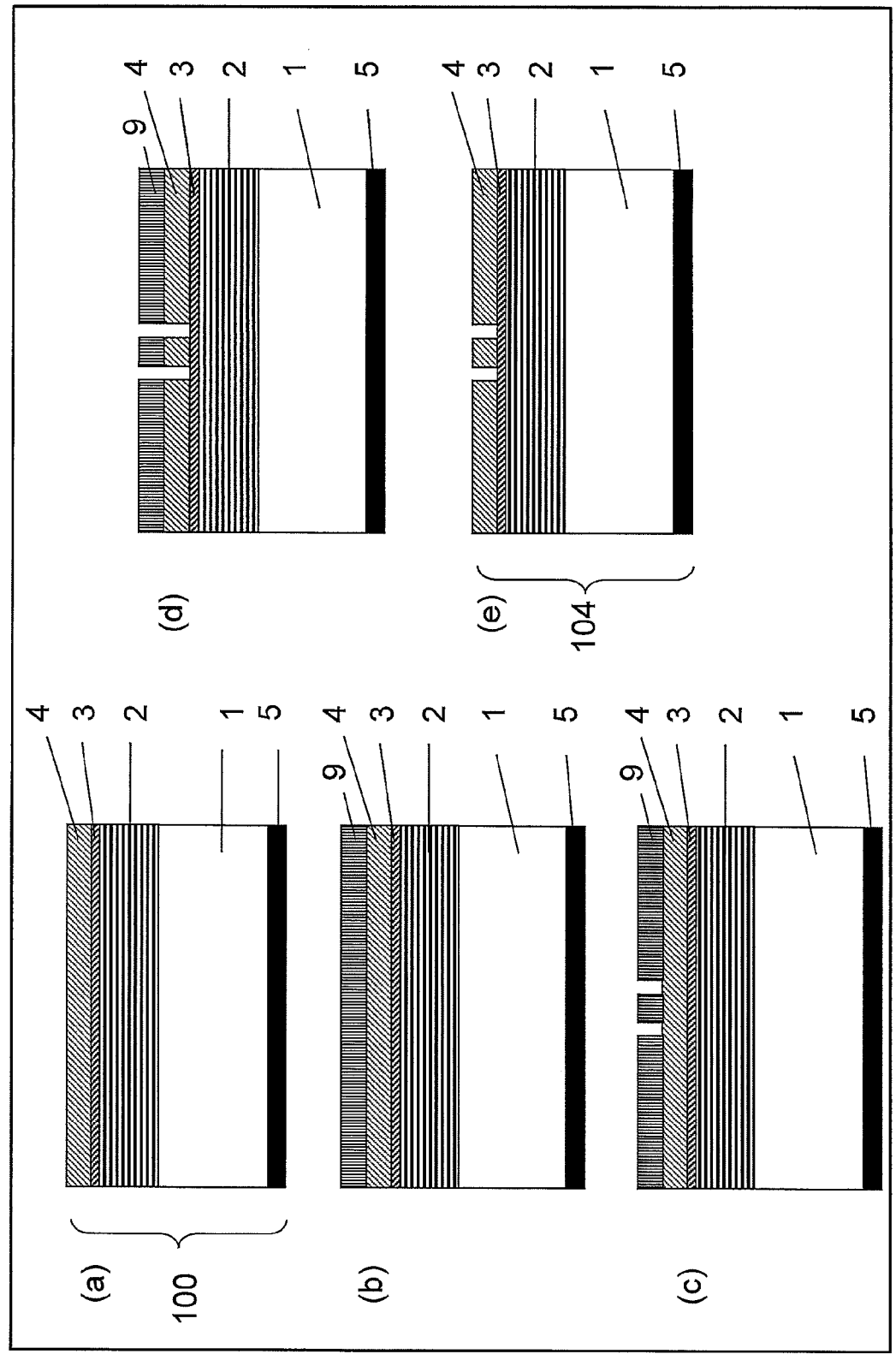
FIG. 2 includes outline cross sectional views showing production steps (up to forming of a pattern) of a reflective mask according to an Example of the first embodiment of the present invention.
Figure 3:
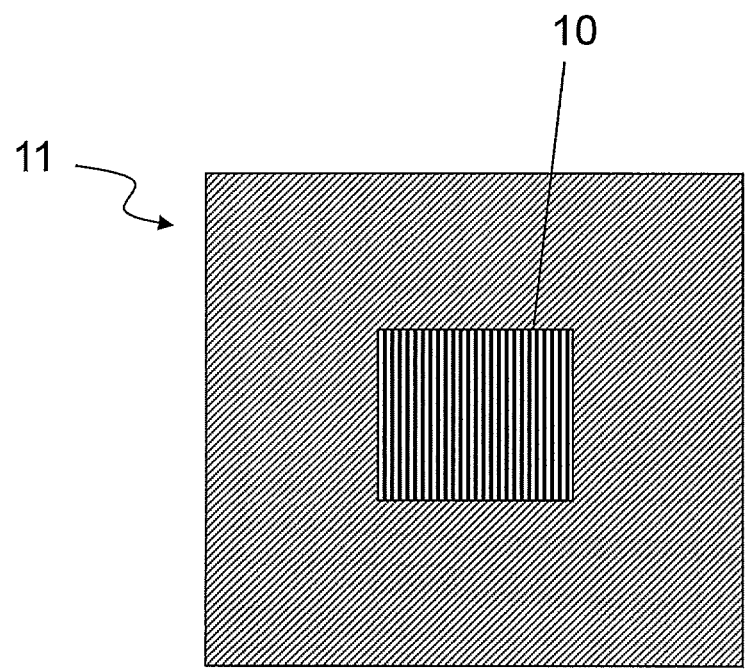
FIG. 3 is an outline plan view showing a reflective mask according to an Example of the first embodiment of the present invention (up to forming of a pattern).

Next, etching was performed on the absorption layer 4 with $CF_4$ plasma and $Cl_2$ plasma using a dry etching device ((d) of FIG. 2), and a resist-stripping rinse was performed to produce a reflective mask 104 having an evaluation pattern shown in (e) of FIG. 2. The evaluation pattern was a line-and-space pattern of 1:1 having a size of 200 nm disposed at the center of the mask. The size of the pattern area was set as 10 cm×10 cm. The top view of the reflective mask 104 is shown in FIG. 3.

Next, a step was performed to form the light-shielding frame 11 on the pattern area 10 of the reflective mask 104 having the evaluation pattern described above. An i-line resist 29 was applied to the reflective mask 104 ((a) of FIG. 4) with a film thickness of 500 nm ((b) of FIG. 4), and drawing and developing were performed thereon with an i-line drawing machine (ALTA) to form a resist pattern having removed therefrom an area that will later become the light-shielding frame 11 ((c) of FIG. 4). The resist pattern had an opening width of 5 mm, and was arranged 3 μm (micrometer) away from the 10 cm×10 cm main pattern area at the central part of the mask.

Next, the absorption layer 4 and the multilayered reflective layer 2 at the opening part of the resist were penetrated and stripped ((d) and (e) of FIG. 4) through vertical dry etching with $CHF_3$ plasma using a dry etching device (pressure in the dry etching device of 50 mTorr, ICP (inductively coupled plasma) power of 500 W, RIE (reactive ion etching) power of 2000 W, $CHF_3$: flow 20 sccm, processing time of 6 minutes, the same applies for the denotation hereinafter). Then, by performing wet etching for 4 minutes using a mixed solution of nitric acid, phosphoric acid, and fluoric acid, side etching is provided to the multilayered reflective layer of Mo and Si, and the shape as shown in (f) of FIG. 4 was obtained.

Figure 4:
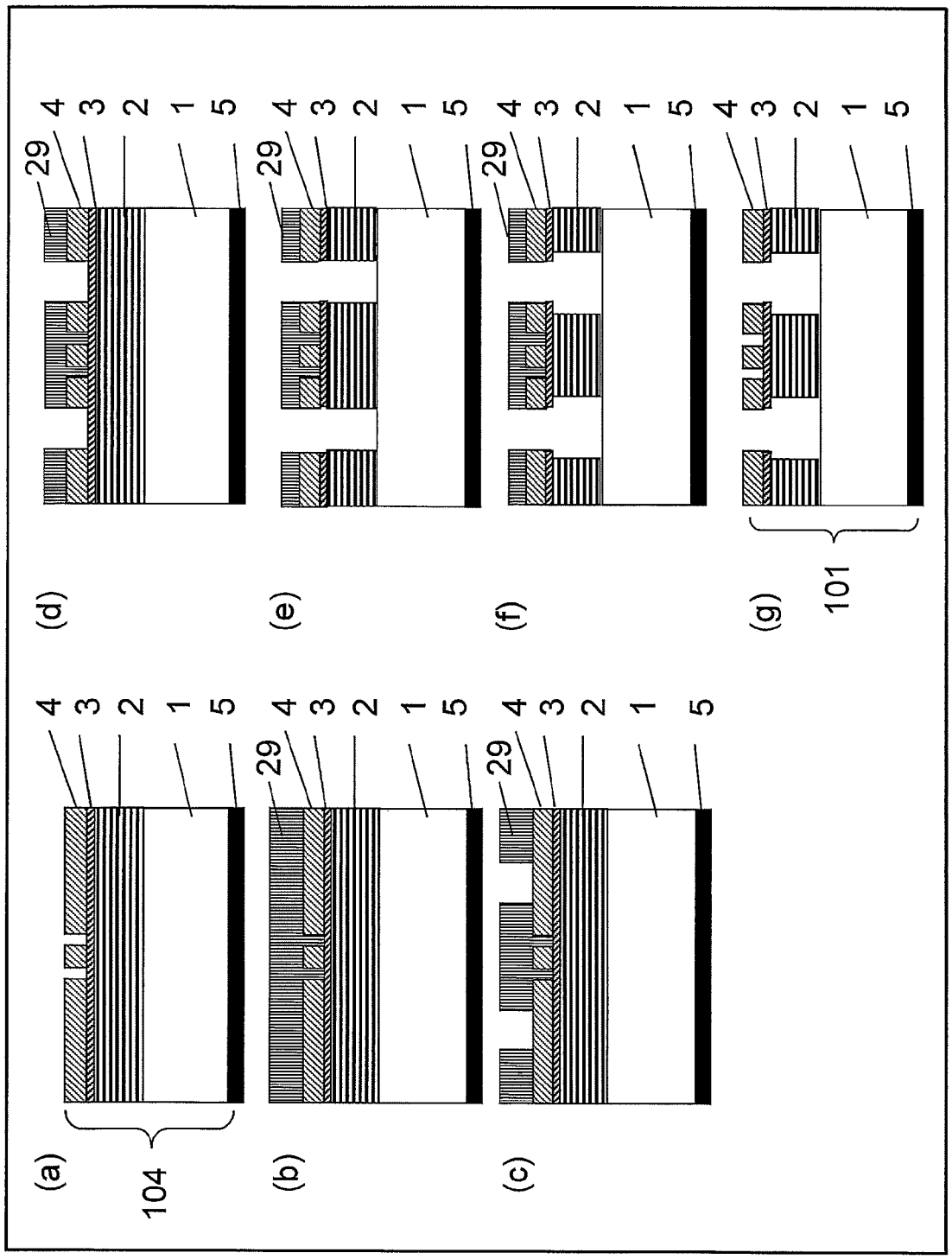
FIG. 4 includes outline cross sectional views showing production steps (up to forming of a light-shielding frame) of a reflective mask according to an Example of the first embodiment of the present invention.
Figure 5:
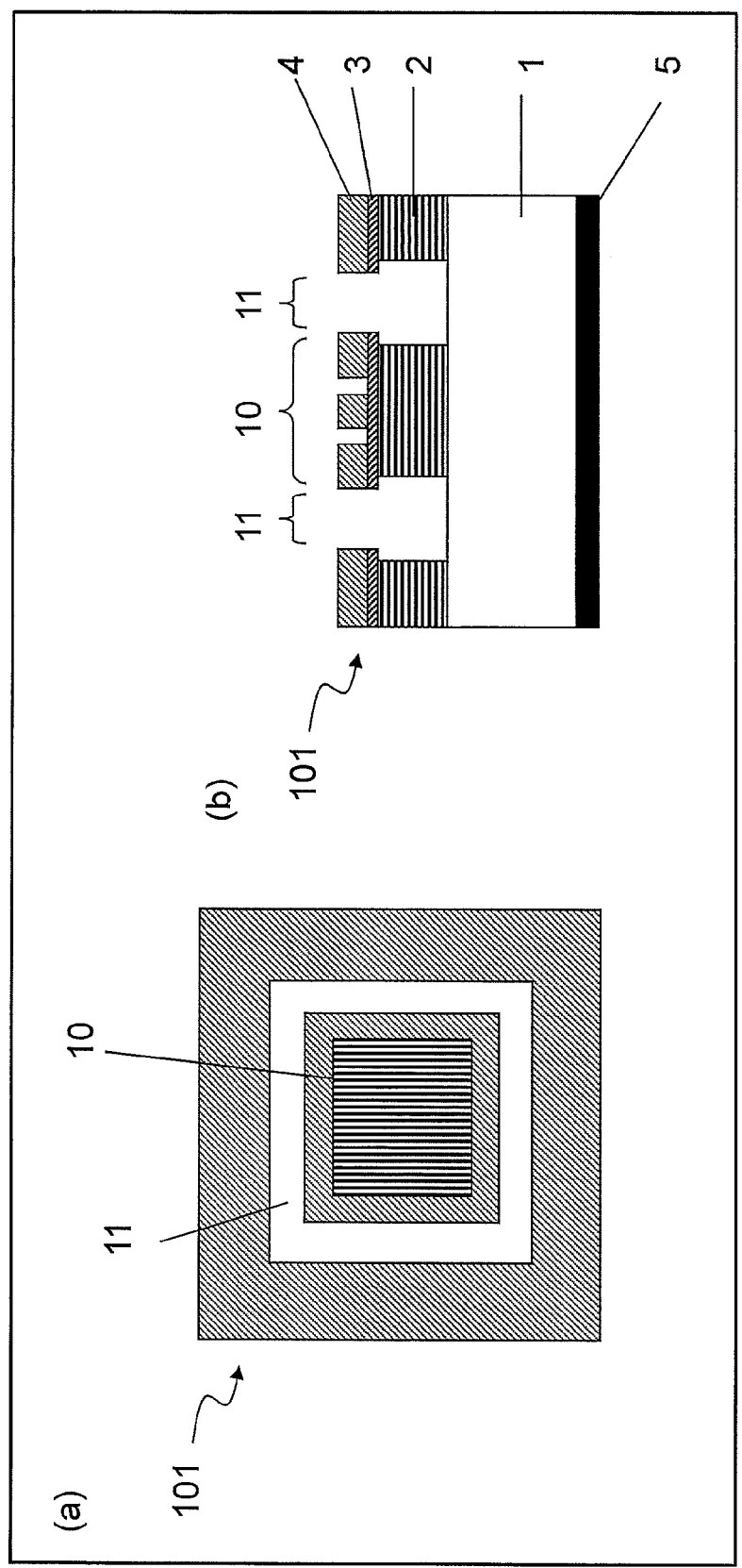
FIG. 5 includes schematic diagrams showing a reflective mask according to an Example of the first embodiment of the present invention.

Lastly, resist that had remained after dry etching and wet etching was stripped ((g) of FIG. 4) through a resist-stripping rinse using a sulfuric-acid based stripping liquid and an ammonia hydrogen peroxide solution. In FIG. 5, (a) and (b) show the reflective mask 101 produced and completed in the present example.

When one part of the light-shielding frame 11 produced in such manner was cut and a cross section thereof was observed through electron microscopy, it was confirmed that side etching of approximately 40 nm on one side (approximately 80 nm with both sides) (=equivalent to 28.6% of the film thickness of the multilayered reflective layer 2) had been formed on the multilayered reflective layer.

Example 1-2

A second Example of the method for manufacturing the reflective mask of the present embodiment will be described. The method for forming the main pattern part is a method identical to that of Example 1.

Figure 6:
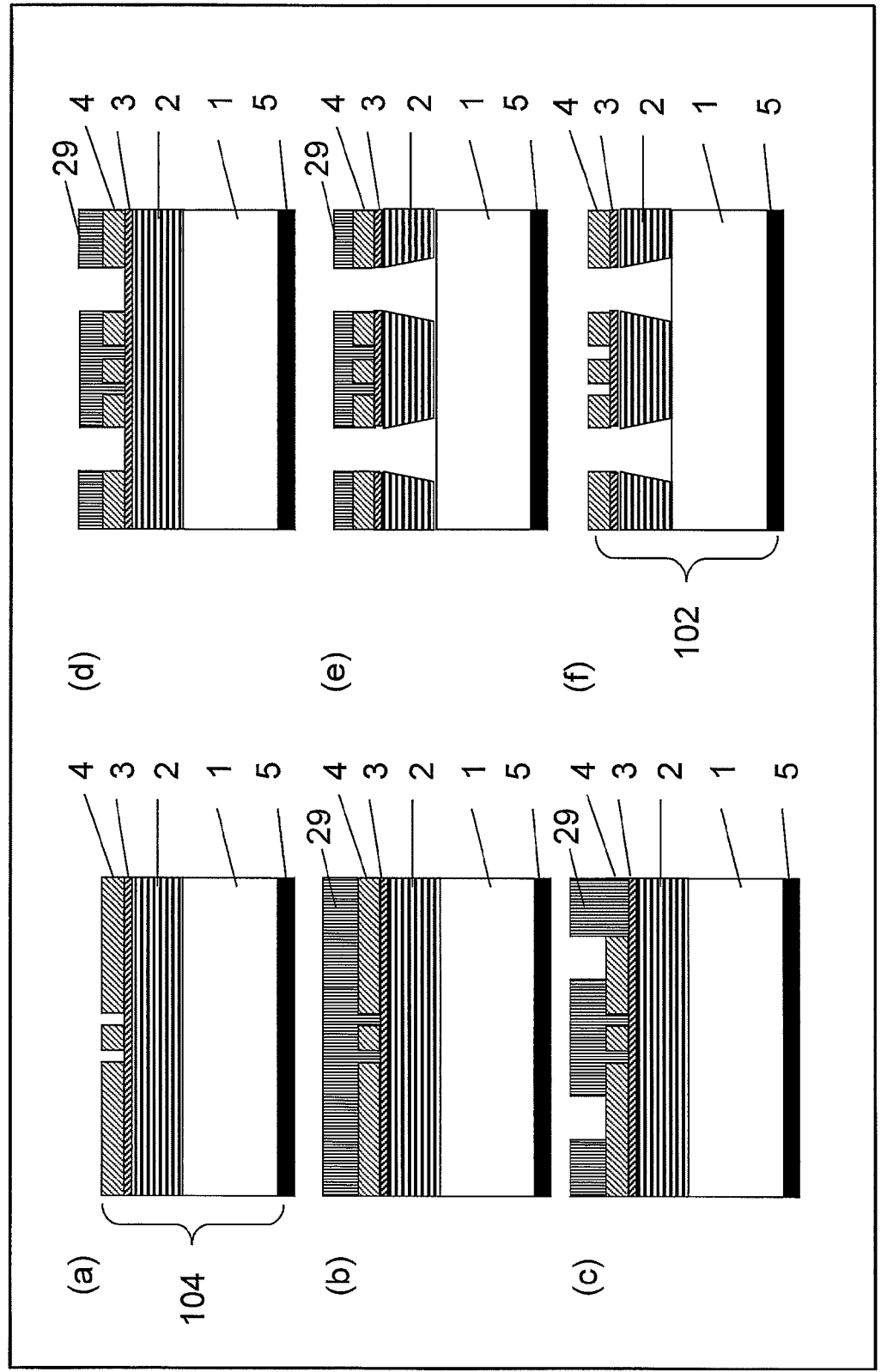
FIG. 6 includes outline cross sectional views showing production steps (up to forming of a light-shielding frame) of a reflective mask according to an Example of the first embodiment of the present invention.

In the present example, a step was performed to form the light-shielding frame 11 on the pattern area 10 ((a) of FIG. 6) of the reflective mask 104. The i-line resist 29 was applied to the reflective mask 104 with a film thickness of 500 nm ((b) of FIG. 6), and drawing and developing were performed thereon with an i-line drawing machine (ALTA) to form, on the resist portion, a resist pattern having removed therefrom an area that will later be the light-shielding frame 11 ((c) of FIG. 6). The resist pattern had an opening width of 5 mm, and was arranged 3 μm away from the 10 cm×10 cm main pattern area at the central part of the mask.

Next, the absorption layer was stripped ((d) of FIG. 6) through dry etching with $CHF_3$ plasma (pressure of 15 mTorr, ICP of 300 W, RIE of 100 W, $CHF_3$: 20 sccm, processing time of 1 minute).

Next, the shape shown in (e) of FIG. 6 was formed by simultaneously penetrating the multilayered reflective layer 2 at the opening part of the resist and giving thereto a reverse tapered shape, with $CF_4$ plasma using a dry etching device (pressure of 50 mTorr, ICP of 500 W, RIE of 50 W, $CF_4$: 20 sccm, processing time of 12 minutes). Next, the resist that had remained after dry etching was stripped ((f) of FIG. 6) through a resist-stripping rinse using a sulfuric-acid based stripping liquid and an ammonia hydrogen peroxide solution.

Figure 7:
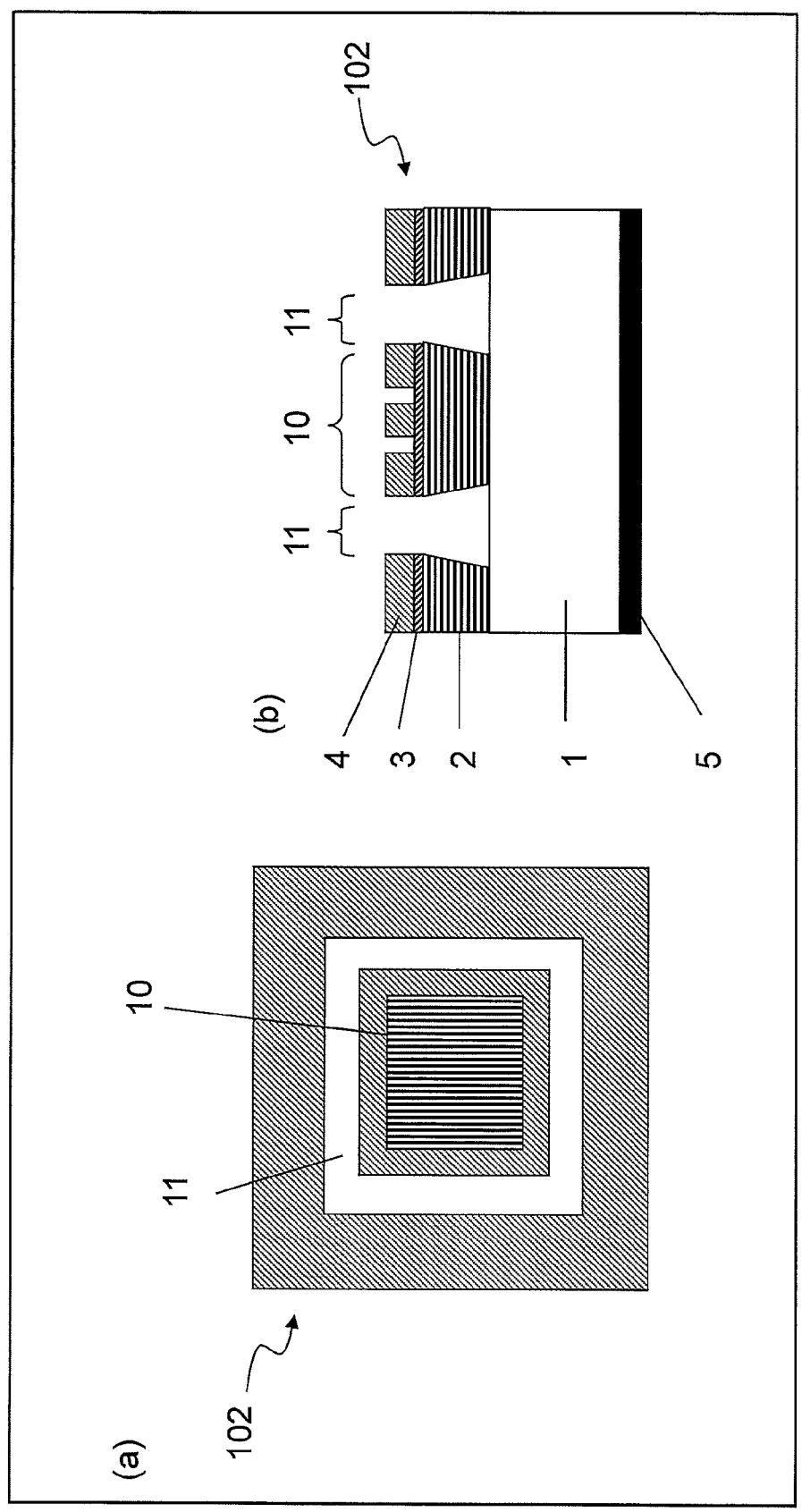
FIG. 7 includes schematic diagrams showing a reflective mask according to Examples of the first embodiment of the present invention.

In FIG. 7, (a) and (b) show the reflective mask 102 produced and completed in the present example.

When one part of the light-shielding frame 11 produced in such manner was cut and a cross section thereof was observed through electron microscopy, a reverse tapered shape of −12 degrees was confirmed.

Example 1-3

An Example that is different from Examples 1 and 2 of the method for manufacturing the reflective mask of the present invention will be described. The method for forming the main pattern part is a method identical to that of Example 1.

Figure 8:
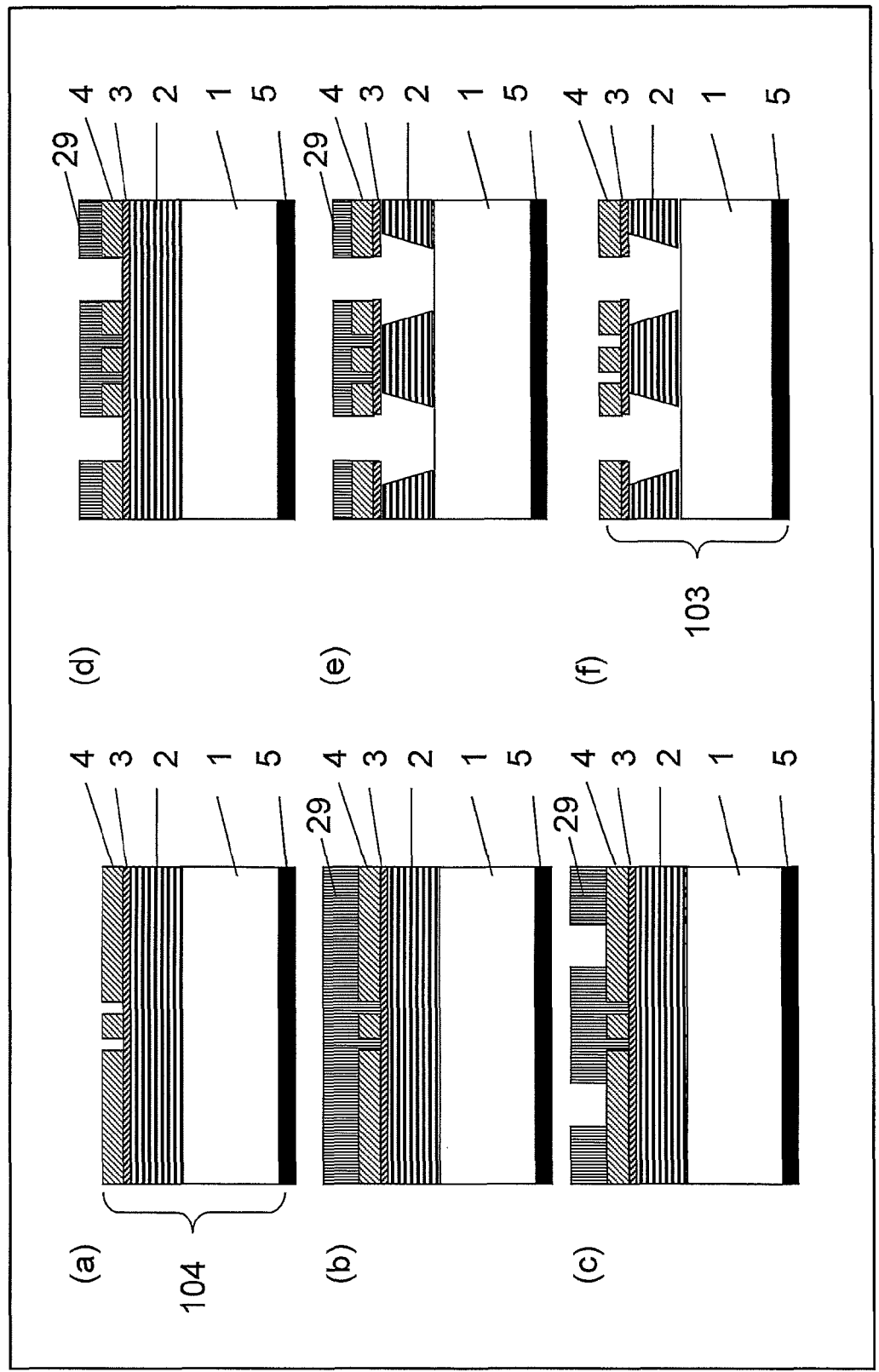
FIG. 8 includes outline cross sectional views showing production steps (up to forming of a light-shielding frame) of a reflective mask according to an Example of the first embodiment of the present invention.

A step was performed to form the light-shielding frame on the pattern area 10 ((a) of FIG. 8) of the reflective mask 104. The i-line resist 29 was applied to the reflective mask 104 with a film thickness of 500 nm ((b) of FIG. 8), and drawing and developing were performed thereon with an i-line drawing machine (ALTA) to form, on the resist portion, a resist pattern having removed therefrom an area that will later be the light-shielding frame ((c) of FIG. 8). The resist pattern had an opening width of 5 mm, and was arranged 3 µm away from the 10 cm×10 cm main pattern area at the central part of the mask. Next, the absorption layer was stripped ((d) of FIG. 8) through dry etching with $CHF_3$ plasma (pressure of 15 mTorr, ICP of 300 W, RIE of 100 W, $CHF_3$: 20 sccm, processing time of 1 minute).

Figure 9:
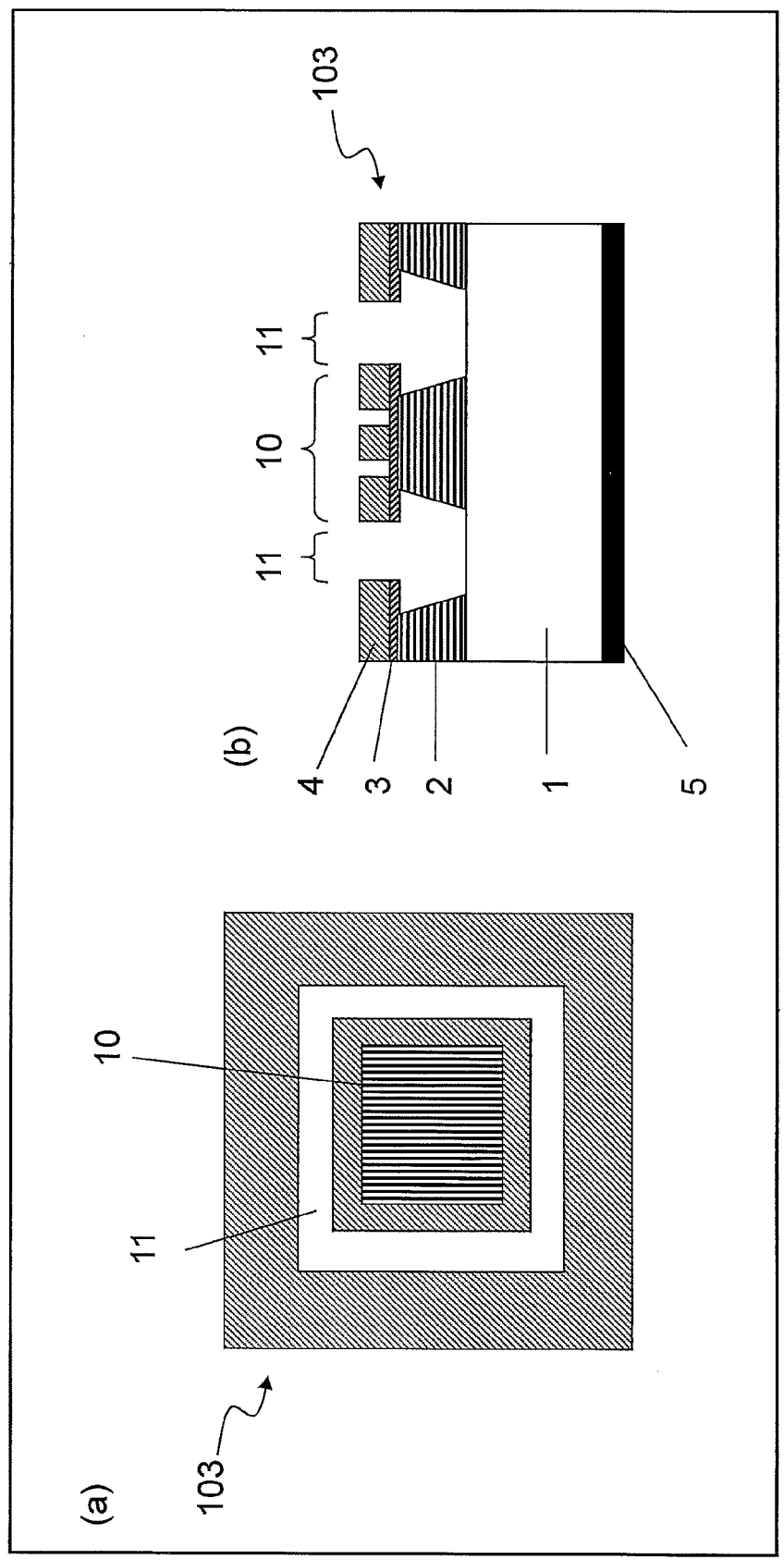
FIG. 9 includes schematic diagrams showing a reflective mask according to an Example of the first embodiment of the present invention.

Next, a shape as shown in (e) of FIG. 8 was formed by penetrating the multilayered reflective layer 2 at the opening part of the resist and providing thereto side etching, with $SF_6$ plasma using a dry etching device (pressure of 50 mTorr, ICP of 800 W, RIE of 25 W, $SF_6$: 40 sccm, processing time of 8 minutes). Next, the resist that had remained after dry etching was stripped ((f) of FIG. 8) through a resist-stripping rinse using a sulfuric-acid based stripping liquid and an ammonia hydrogen peroxide solution. In FIG. 9, (a) and (b) show the reflective mask 103 produced and completed in the present example.

When one part of the light-shielding frame produced in such manner was cut and a cross section thereof was observed through electron microscopy, it was confirmed that, in the opening width of the hem part (a part in contact with the substrate 1) of the multilayered reflective layer 2, side etching of approximately 46 nm on one side (approximately 92 nm with both sides) (=equivalent 32.8% of the film thickness of the multilayered reflective layer) had been formed on the multilayered reflective layer.

Figure 10:
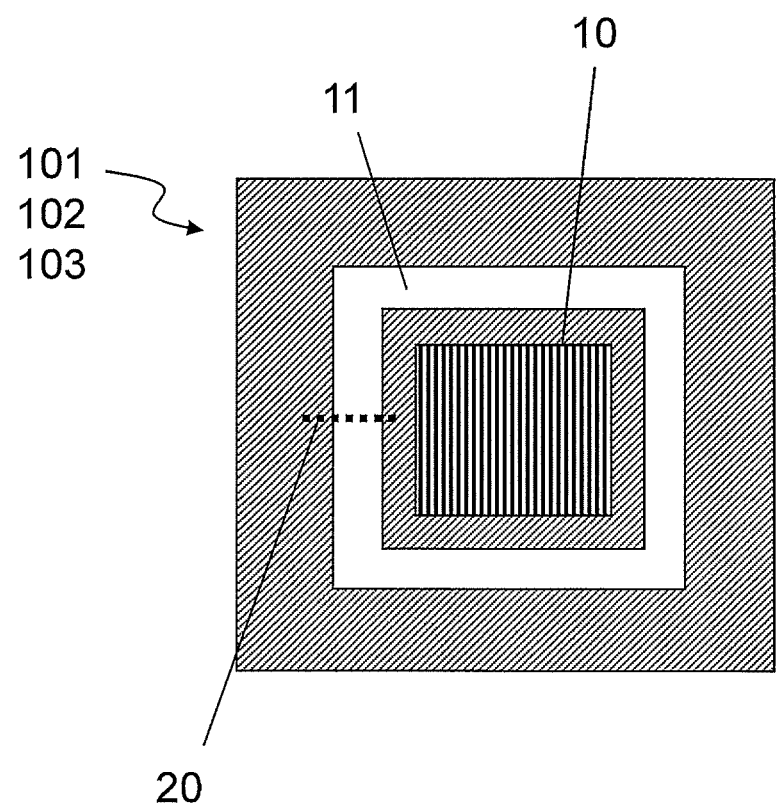
FIG. 10 is a schematic diagram showing points for measuring EUV reflectance in a light-shielding frame part of a reflective mask according to Examples of the first embodiment of the present invention.

EUV reflectances of light-shielding frame parts of the respective reflective masks of the Examples described above and a conventional reflective mask were measured. As shown in FIG. 10, measuring points 20 were multiple points between a part on the pattern area 10 side of the light-shielding frame parts of the respective reflective masks and a part on the side of a mask extension part (picture frame-like part) from the light-shielding frame part.

Figure 11:
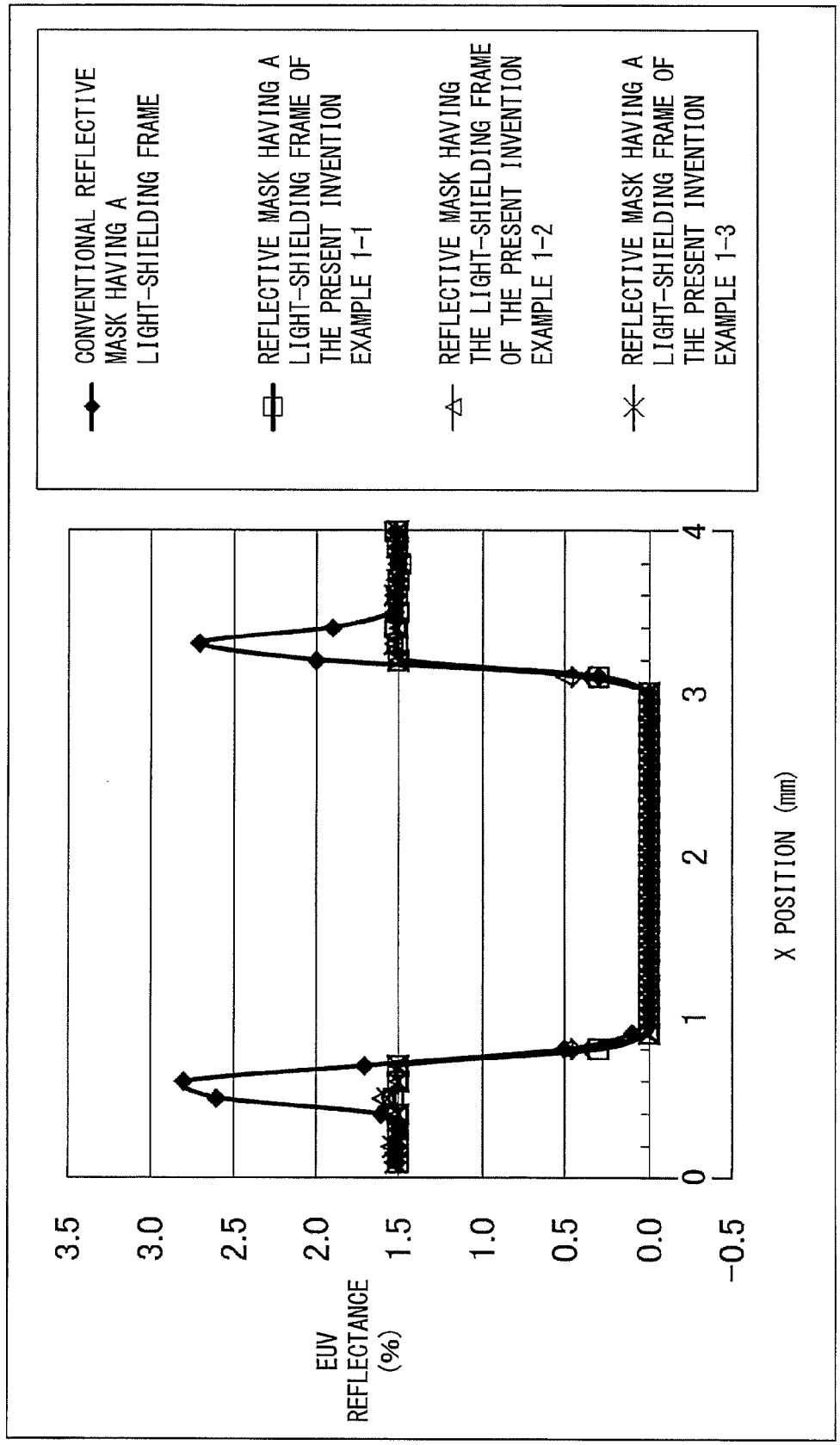
FIG. 11 is a schematic diagram showing data of EUV reflectance at the light-shielding frame part of the reflective mask according to the Example of the first embodiment of the present invention.

As a result, although the light-shielding frame part of a conventional reflective mask exhibited a high value of EUV reflectance at the vicinity of the edge of the light-shielding frame, high EUV reflectance was not observed in the vicinity of the edge of the light-shielding frame in the respective reflective masks of the Examples. The results are shown in FIG. 11. As described here, it was possible to produce a reflective mask having a light-shielding frame with high light-shielding performance.

Second Embodiment

In the following, a second embodiment of the present invention will be described with reference to the drawings.

<Configuration of Reflective Mask Before Forming Circuit Pattern>

Figure 12:
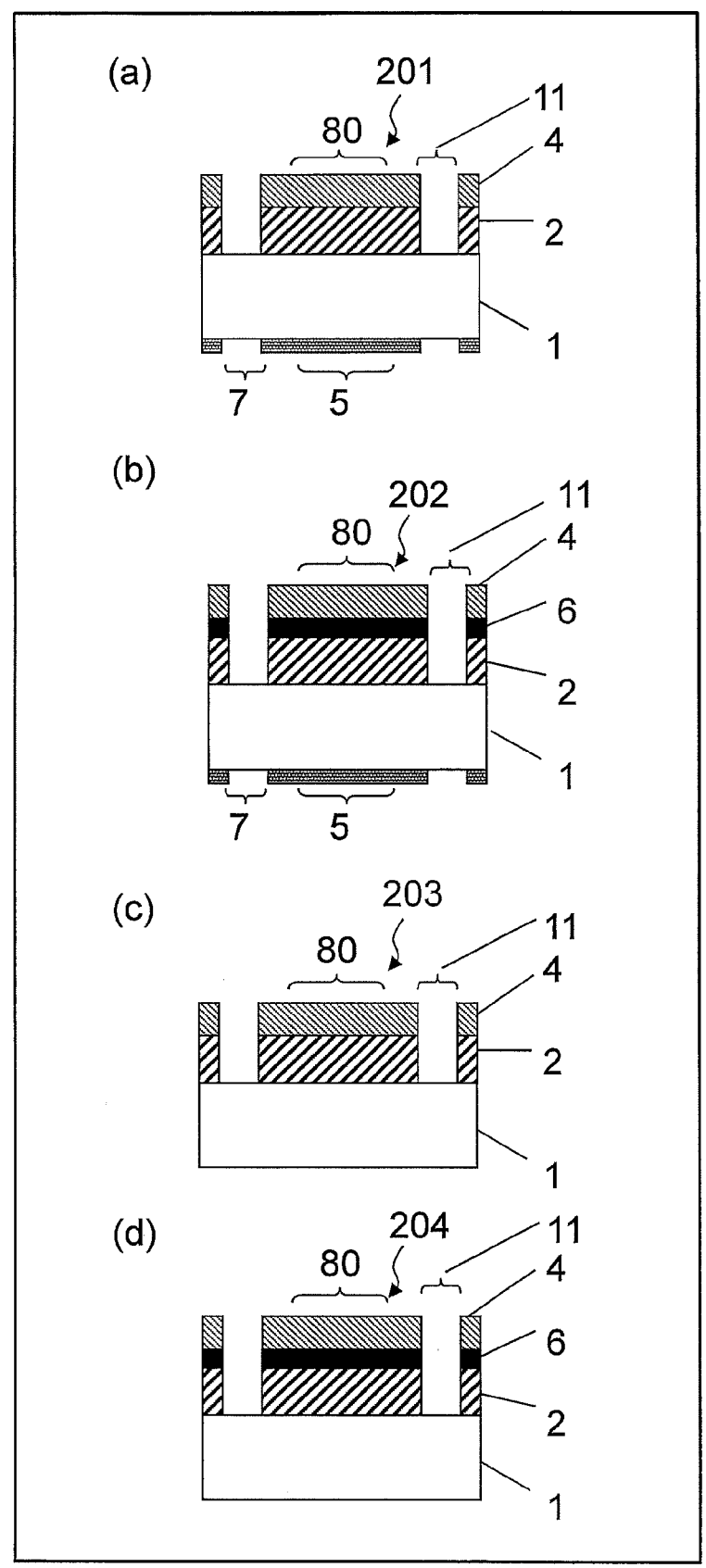
FIG. 12 includes outline cross sectional views showing structures of reflective masks according to a second embodiment of the present invention.
Figure 13:
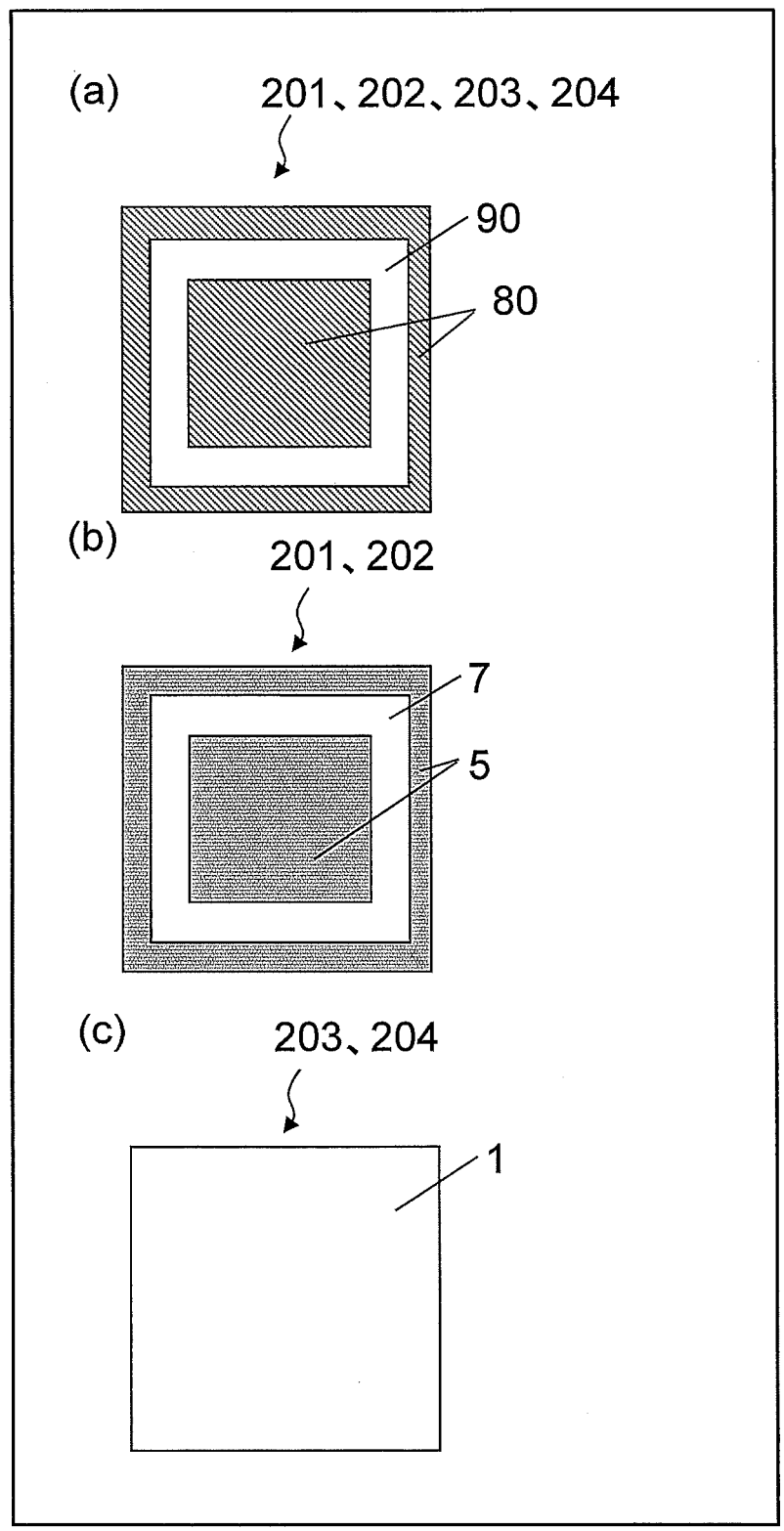
FIG. 13 includes schematic diagrams showing relevant parts of the reflective masks according to the second embodiment of the present invention.

First, the configuration of the reflective mask before forming a circuit pattern will be described with reference to FIG. 12 and FIG. 13. In FIG. 12, (a) to (d) show outline cross sectional views of substantially central portions of reflective masks 201, 202, 203, and 204 of an embodiment of the present invention. In FIG. 13, (a) is a schematic diagram viewing the reflective masks 201, 202, 203, and 204 shown in (a) to (d) of FIG. 12 from one surface sides thereof, (b) of FIG. 13 is a schematic diagram viewing the reflective masks 201 and 202 from the other surface side, and (c) of FIG. 13 is a schematic diagram viewing the reflective masks 203 and 204 from the other surface side. It should be noted that, in the following description, the surface on the side of the reflective masks 201, 202, 203, and 204 where the circuit pattern of the substrate 1 is formed will be referred to as one surface, and the opposite surface thereof will be referred to as the other surface.

In the reflective mask 201 shown in (a) of FIG. 12, the multilayered reflective layer (light reflection layer) 2 is formed on the one surface of the substrate 1, the absorption layer (light absorption layer) 4 is formed on the multilayered reflective layer 2, and the conductive film 5 is formed on the other surface of the substrate 1.

The reflective mask 202 shown in (b) of FIG. 12 is formed by adding a buffer layer 6 between the absorption layer 4 and the multilayered reflective layer 2 of the reflective mask 201, and the multilayered reflective layer 2, the buffer layer 6, and the absorption layer 4 are sequentially formed on the one surface of the substrate 1. In addition, the conductive film 5 is formed on the other surface of the substrate 1.

The reflective masks 203 and 204 shown in (c) and (d) of FIG. 12 have a configuration lacking the conductive film 5 from the other surface of the reflective masks 201 and 202.

As shown in (a) of FIG. 13, an absorption layer area 80 and a frame-shaped area 90 which has a picture-frame shape are formed on the one surface of the reflective masks 201, 202, 203, and 204. As shown in FIG. 12, in the frame-shaped area 90, the light-shielding frame 11 is formed by stripping, in a trench-like manner, the multilayered reflective layer 2 and the absorption layer 4, or the multilayered reflective layer 2, the buffer layer 6, and the absorption layer 4. The one surface of the substrate 1 is exposed and uncovered at the bottom part of the light-shielding frame 11.

As shown in (b) of FIG. 13, the conductive film 5 and a conductive film-stripped area 7 which has a picture-frame shape are formed on the other surface of the reflective masks 201 and 202. As shown in (a) and (b) of FIG. 12, in the conductive film-stripped area 7, the conductive film 5 of the frame-shaped area 90 is stripped in a trench-like manner. The other surface of the substrate 1 is exposed and uncovered at the bottom part of the conductive film-stripped area 7. As shown in (c) of FIG. 13, the conductive film 5 is not disposed on the other surface of the reflective masks 203 and 204, and the entire surface of the other surface of the substrate 1 is exposed and uncovered.

The method for forming the light-shielding frame 11 and the conductive film-stripped area 7 shown in FIG. 12 and FIG. 13 will be described. In the present embodiment, high energy laser light with short wavelength generated by YAG laser (266 nm, tertiary harmonic wave of 1064 nm, is used) is used. This laser light passes through the substrate 1, but is untransmissive with respect to the multilayered reflective layer 2, the absorption layer 4, the buffer layer 6, and the conductive film 5.

First, in (a) of FIG. 12, the conductive film 5 is formed on the entire surface of the other surface of the substrate 1 in the reflective mask 201, and then the multilayered reflective layer 2 and the absorption layer 4 are formed on the entire surface of the one surface of the substrate 1. Next, laser light is emitted in the range of the frame-shaped area 90 from the one surface side or the other surface side. As a result, the multilayered reflective layer 2, the absorption layer 4, and the conductive film 5 are collectively stripped to form the light-shielding frame 11 and the conductive film-stripped area 7.

Also with the reflective masks 202, 203, and 204 in (b), (c), and (d) of FIG. 12, the light-shielding frame 11, or the conductive film-stripped area 7 and the light-shielding frame 11 are formed by collectively stripping the multilayered reflective layer 2, the buffer layer 6, the absorption layer 4, and the conductive film 5, the multilayered reflective layer 2 and the absorption layer 4, or the multilayered reflective layer 2, the buffer layer 6, and the absorption layer 4 through irradiation using laser light in a similar manner.

It should be noted that although the light-shielding frame 11 and the conductive film-stripped area 7 are formed before forming the circuit pattern in the description of the present embodiment, they may be formed after forming the circuit pattern. In addition, although YAG laser is used for the laser light, $CO_2$ laser may also be used.

As described above, in the reflective masks 201 and 202 shown in (a) and (b) of FIG. 12, the light-shielding frame 11 is trench like, the one surface of the substrate 1 is exposed at the bottom part, and the conductive film-stripped area 7 is also formed at the reverse side of the substrate 1 to expose the other surface of the substrate 1. Thus, OoB light that has passed through the substrate from the bottom part of the light-shielding frame 11 will not be reflected at the conductive film on the other surface and passes through the substrate again to return to the mask surface. As a result, influence of OoB light can be reduced.

In addition, in the reflective masks 203 and 204 shown in (c) and (d) of FIG. 12, the conductive film 5 is not disposed on the other surface, and the entire surface of the other surface of the substrate 1 is exposed and uncovered. Thus, OoB light that has passed through the substrate from the bottom part of the light-shielding frame 11 will not be reflected at the conductive film on the other surface and passes through the substrate 1 again to return to the mask surface. As a result, influence of OoB light can be reduced. It should be noted that, in this case, the reflective masks 203 and 204 are fixed within an exposure machine, which is not diagrammatically represented, by a vacuum chuck or the like.

Furthermore, since the multilayered reflective layer 2, the absorption layer 4, and the conductive film 5 etc., are collectively stripped through laser irradiation to form the light-shielding frame 11 and the conductive film-stripped area 7, a higher throughput than a method of digging with dry etching or the like can be obtained. In addition, since both surfaces of the substrate 1 can be simultaneously stripped with laser, high accuracy of position at both surfaces can be obtained, and influence of OoB can be drastically reduced. Thus, when forming a transcription circuit pattern on a semiconductor substrate, the transcription pattern can be formed with high accuracy.

<Details of Configuration of Reflective Mask: Multilayered Reflective Layer>

The multilayered reflective layer 2 of (a) and (c) of FIG. 12 is obtained by particularly forming the uppermost layer with Ru in the multilayered reflective layer 2 set forth in the first embodiment. The Ru at the uppermost layer can be considered as a protective layer since the Ru plays a role as protection against chemicals used during rinsing of the mask and a role as a stopper during processing of the absorption layer.

The multilayered reflective layer 2 of (b) and (d) of FIG. 12 is obtained by particularly forming the uppermost layer with Si in the multilayered reflective layer 2 set forth in the first embodiment. The Si at the uppermost layer can be considered as a protective layer since the Si plays a role similar to Ru described above.

<Details of Configuration of Reflective Mask: Buffer Layer>

The buffer layer 6 in (b) and (d) of FIG. 12 is similar to the buffer layer set forth in the first embodiment. The buffer layer 6 is provided for protecting the, when pattern-correcting or etching the absorption layer 4, the Si layer which is the uppermost layer of the multilayered reflective layer 2 adjacent below the buffer layer 6, and is formed from a nitride (CrN) of chromium (Cr).

<Details of Configuration of Reflective Mask: Absorption Layer>

The absorption layer 4 in (a) to (d) of FIG. 12 is similar to the absorption layer 4 set forth in the first embodiment.

Details of Configuration of Reflective Mask: Conductive Film>

The conductive film 5 in (a) and (b) of FIG. 12 is similar to the conductive film 5 set forth in the first embodiment.

<Description of Circuit-Patterned Reflective Mask>

Figure 15:
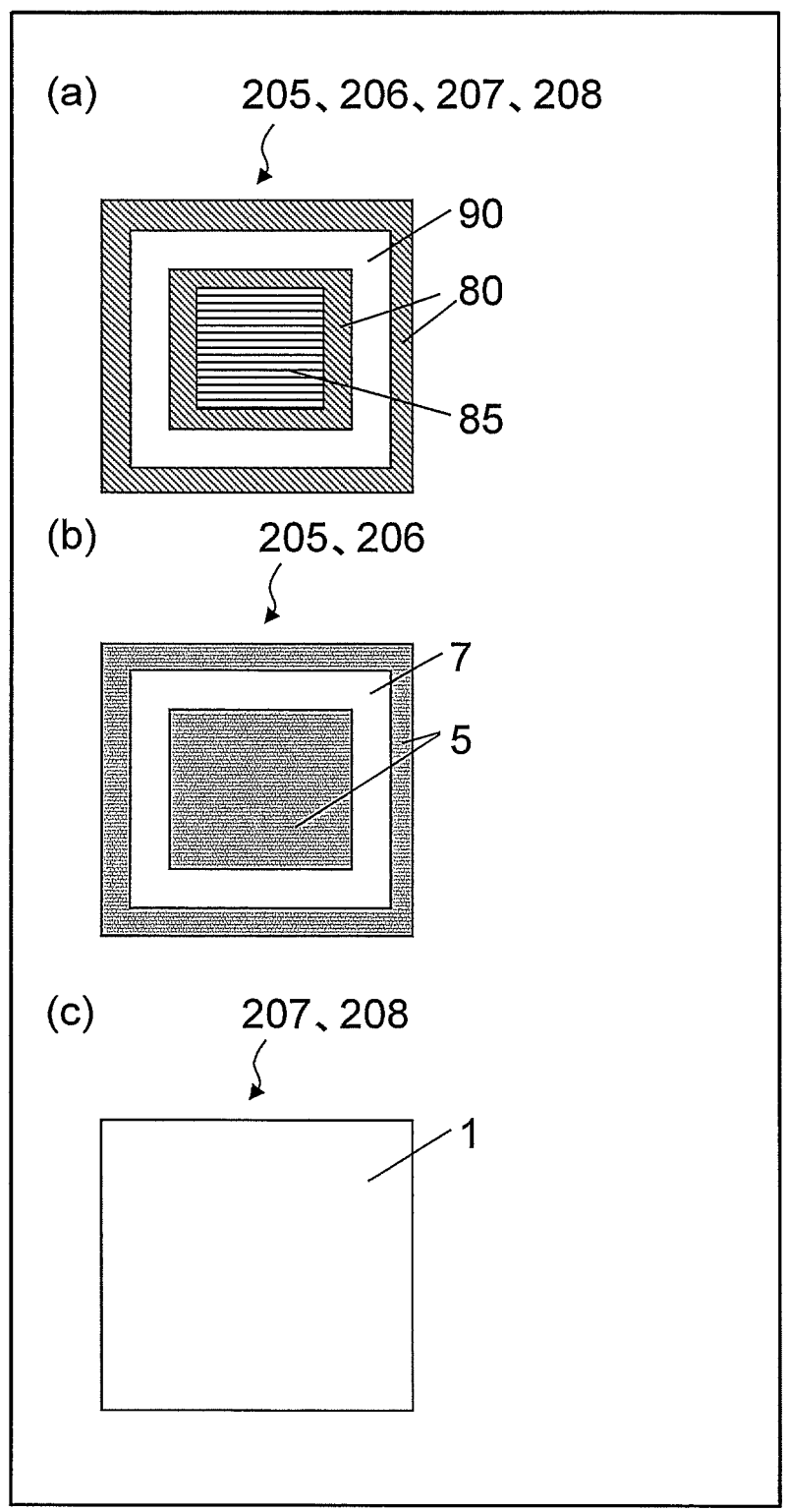
FIG. 15 includes schematic diagrams showing relevant parts of the reflective masks according to the second embodiment of the present invention.

Next, a circuit-patterned reflective mask obtained by forming a circuit pattern on the reflective mask described above will be described. In FIG. 14, (a) to (d) show outline cross sectional views of substantially central portions of circuit-patterned reflective masks 205, 206, 207, and 208 obtained by forming a circuit pattern 85 on the reflective masks 201, 202, 203, and 204. In FIG. 15, (a) is a schematic diagram viewing the circuit-patterned reflective masks 205, 206, 207, and 208 from the one surface side. In FIG. 15, (b) is a schematic diagram viewing the circuit-patterned reflective masks 205 and 206 from the other surface side, and (c) of FIG. 15 is a schematic diagram viewing the reflective masks 207 and 208 from the other surface side.

In all cases, the circuit pattern 85 is formed by digging into the absorption layer 4 and the buffer layer 6, or the absorption layer 4 at the upper part of the multilayered reflective layer 2 located inside the light-shielding frame 11. Since the light-shielding frame 11 and the conductive film-stripped area 7 are already formed in the case with the present embodiment; by forming the circuit pattern 85, a reflective mask having the frame-shaped area 90 whose reflectance against EUV light is sufficiently smaller than that of the absorption layer area can be obtained.

<Method for forming Circuit Pattern>

Next, a method for forming the circuit pattern 85 will be explained in detail.

In the case with the reflective mask 201 or 203 shown in (a) or (c) of FIG. 12, a resist pattern is formed with electron-beam lithography, and then the absorption layer 4 is etched with fluorocarbon plasma or chlorine plasma, or both plasmas if necessary. After that, the circuit-patterned reflective mask 205 or 207, having the circuit pattern 85 formed on the absorption layer 4, shown in (a) or (c) in FIG. 14 can be obtained by performing a resist-stripping rinse.

Also in the case with the reflective mask 202 or 204 shown in (b) or (d) of FIG. 12, a resist pattern is similarly formed with electron-beam lithography, and then the absorption layer 4 is etched with fluorocarbon plasma or chlorine plasma, or both plasmas if necessary. Next, the buffer layer 6 is etched using chlorine plasma. Then, the circuit-patterned reflective mask 206 or 208, having the circuit pattern 85 formed on the absorption layer 4 and the buffer layer 6, shown in (b) or (d) of FIG. 14 can be obtained by performing a resist-stripping rinse. In such manner, the reflective masks 205 to 208 having the frame-shaped area whose reflectance against EUV light is sufficiently smaller than that of the absorption layer area can be obtained.

It should be noted that the reflective mask and the method for manufacturing the reflective mask of the present embodiment are not limited to the embodiments described above, and various modifications are possible. In the embodiments described above, the multilayered reflective layer 2 is formed directly on the one surface of the substrate 1. However, in one example, a conductive film for preventing charge-up during exposure may be interposed between the substrate 1 and the multilayered reflective layer 2.

Example 2

In order to describe the present embodiment in further detail, the following Example will be presented. However, the present embodiment is not limited only to the Example. It should be noted that the order of the step of forming the light-shielding frame 11 and the step of forming the circuit pattern 85 are reversed between the embodiment described above and the Example set forth in the following.

<Method for Manufacturing Reflective Mask Blank>

In the following, an example of the method for manufacturing the reflective mask of the present invention will be described. First, as shown in (a) of FIG. 16, the substrate 1, which is a low thermal-expansion glass substrate used in the present example, was prepared. Next, as shown in (b) of FIG. 16, the conductive film 5 for electrostatic chucking was formed on the other surface of the substrate 1 using a sputtering device. Furthermore, as shown in (c) of FIG. 16, the multilayered reflective layer 2, including 40 pairs of molybdenum (Mo) and silicon (Si) and designed such that reflectance against EUV light with a wavelength of 13.5 nm is about 64%, was laminated on the substrate 1. Next, as shown in (d) of FIG. 16, the absorption layer 4 formed of TaN was formed on the multilayered reflective layer 2 using the sputtering device. The film thickness of the absorption layer 4 was set at 50 nm. In the manner described above, a reflective mask blank 200 used in the present invention was produced.

<Patterning of Reflective Mask Blank>

Figure 16:
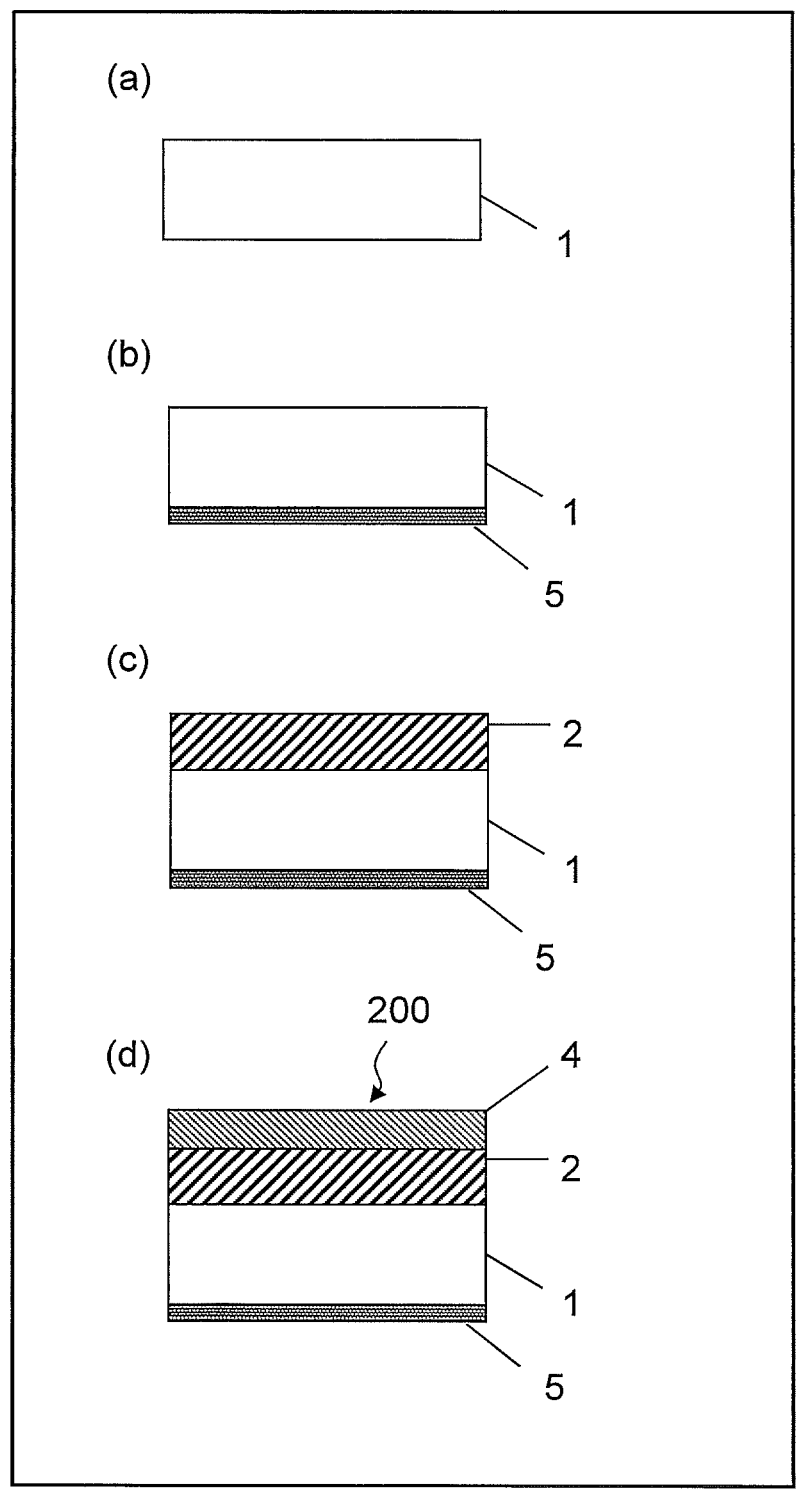
FIG. 16 includes schematic diagrams of a reflective mask according to an Example of the second embodiment of the present invention.
Figure 17:
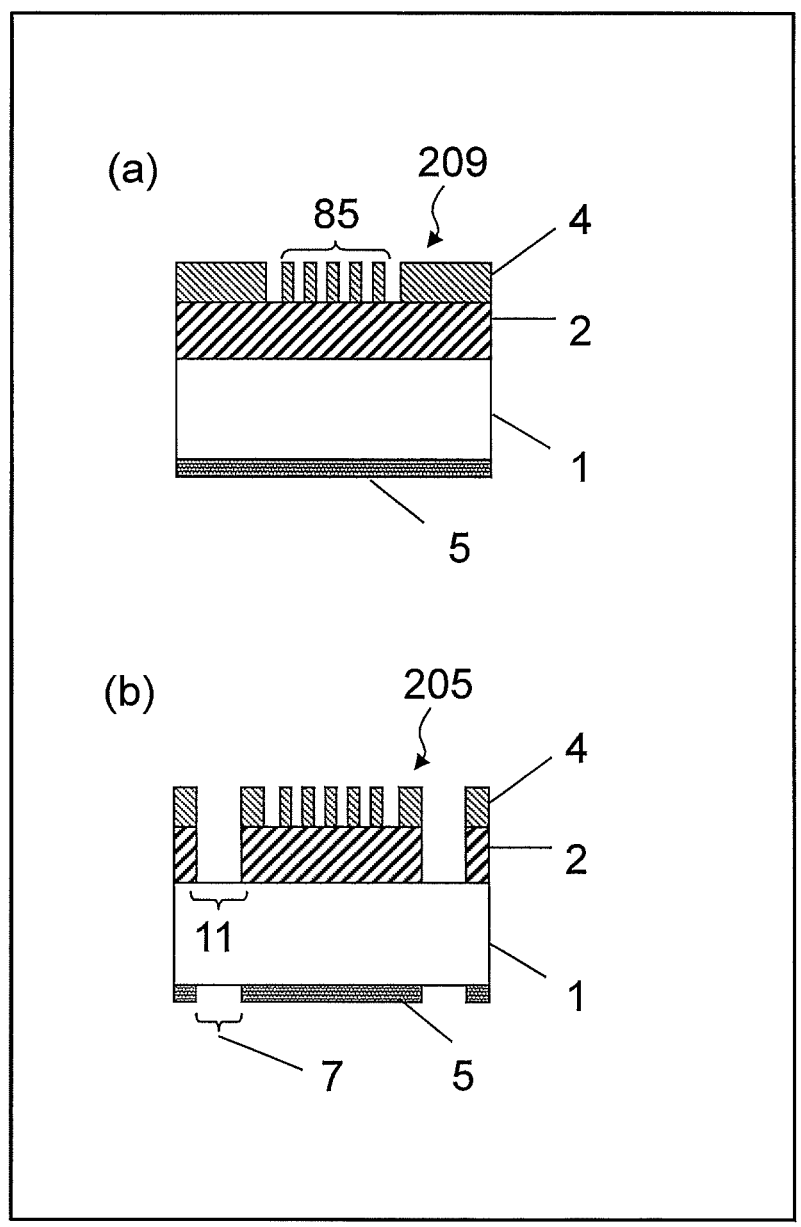
FIG. 17 includes schematic diagrams of reflective masks according to Examples of the second embodiment of the present invention.

Electron-beam lithography, dry etching, and a resist-stripping rinse were performed on the produced reflective mask blank 200 shown in (d) of FIG. 16 to form the circuit pattern 85 on the absorption layer 4 and to produce a reflective mask 209 shown in (a) of FIG. 17. For the electron-beam lithography, a chemically amplified positive resist (product number: FEP-171, manufactured by FUJIFILM Electronic Materials Co., Ltd.) was used. A resist pattern was formed through drawing with a drawing machine (product number: JBX9000, manufactured by JEOL Ltd.) at a dose of 15 µC/cm, and using a 2.38% TMAH (tetramethylammonium hydroxide) developer. Inductive coupling type plasma of $Cl_2$ was applied for the etching of the absorption layer 4.

<Creation of Light-Shielding Frame and Conductive Film-Stripped Area>

With respect to the produced reflective mask 209 shown in (a) of FIG. 17, fourth harmonic wave laser light (266 nm) of YAG laser was emitted from the one surface side at a frequency of 2.5 kHz and an output of 18 A to collectively strip the absorption layer 4, the multilayered reflective layer 2, and the conductive film 5. In such manner, the reflective mask 205 having the light-shielding frame 11 and the conductive film-stripped area 7 as shown in (b) of FIG. 17 were completed.

Reflectance of EUV light (wavelength 13.5 nm) was measured on the absorption layer side of the produced reflective mask 205 shown in (b) of FIG. 17. The result is shown in Table 1. The reflectance in areas other than the light-shielding frame was 1.24%, whereas reflectance of the frame-shaped area was 0.00%. Furthermore, when reflectances at wavelengths in a range from vacuum ultraviolet ray to near-infrared ray were measured for investigating the influence of OoB light, the result was 0.00% for both cases.

TABLE 1

|  | Light-shielding frame part | Ordinary absorption layer part |
|---|---|---|
| EUV light reflectance | 0.00% | 1.24% |
| OoB light reflectance | 0.00% | 0.21% |

Exposure with a light source of 13.5 nm EUV was performed using the reflective mask 210 shown in (b) of FIG. 17 for transcription on four adjacent chips on the semiconductor substrate. Even though areas corresponding to the light-shielding frame on the produced reflective mask were partially overlapped on the adjacent chips, sensitization of resist in the areas of the semiconductor substrate was not observed.

In such manner, with the present embodiment, it is possible to reduce the influence of OoB light that has adverse influence, when the light passes through the substrate, is reflected at the conductive film on the other surface, passes through the substrate again, and returns to the mask surface.

A higher throughput than a dig-in technique such as dry etching for forming a light-shielding frame can be obtained, since the step of forming the light-shielding frame and the step of forming the conductive film-stripped area are collectively performed by stripping the light reflection layer, the light absorption layer, and the conductive film through irradiation using, from the one surface side or the other surface side of the substrate, laser light that is transmissive with respect to the substrate but is untransmissive with respect to the light reflection layer, the light absorption layer, and the conductive film. Furthermore, since it is possible to strip both surfaces simultaneously with laser, accuracy of position on both surfaces of the mask can be increased and influence of OoB at the conductive film interface of the glass and the other surface can be reduced. By using this reflective mask, transcription pattern can be formed with high accuracy.

Furthermore, when the step of forming the light-shielding frame and the step of forming the conductive film-stripped area are performed before forming the circuit pattern, if necessary, it is possible to form the circuit pattern while making adjustments in accordance with the light-shielding frame that has been already formed.

Furthermore, when the step of forming the light-shielding frame and the step of forming the conductive film-stripped area are performed after forming the circuit pattern, if necessary, it is possible to form the light-shielding frame while making adjustments in accordance with the circuit pattern that has been already formed.

Since laser light generated from YAG laser or $CO_2$ laser is used as the laser light, the multilayered reflective layer, the absorption layer, and the conductive film can be stripped with certainty with the high energy laser light with short wavelength.

Since the reflective mask used for EUV lithography is manufactured with any one of the above described reflective mask manufacturing methods, the reflective mask can be obtained with high accuracy.

Third Embodiment

In the following, a third embodiment of the present invention will be described with reference to the drawings.

Figure 18:
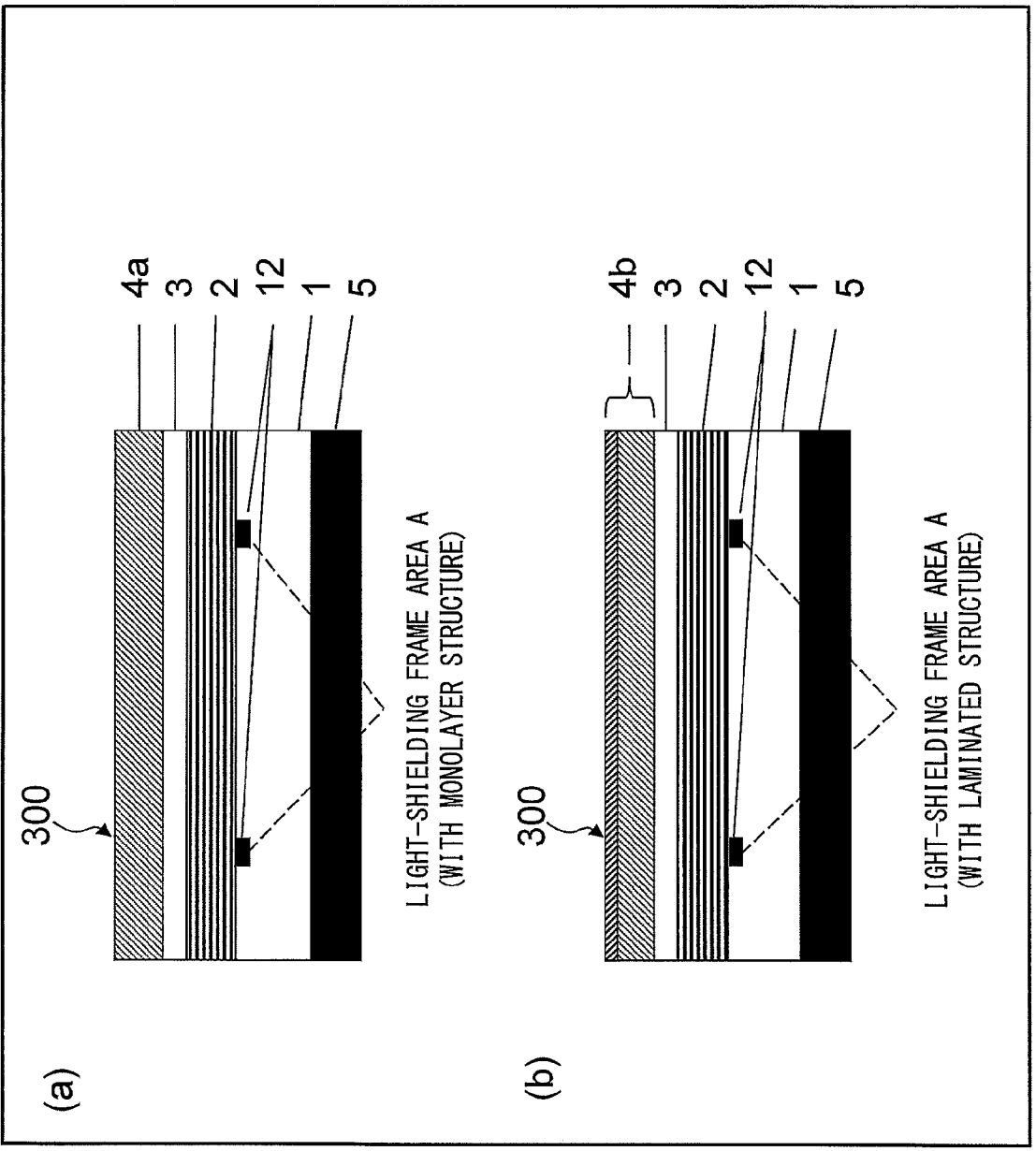
FIG. 18 includes cross sectional views for describing a reflective mask blank according to a third embodiment of the present invention.

First, a reflective mask blank 300 of the present embodiment will be described. In FIG. 18, (a) is a cross sectional view of the reflective mask blank 300. Wavelength of EUV light is, for example, 13.5 nm. A sacrificial film 12 is formed on one part of the upper part of the substrate 1, and the multilayered reflective layer 2, the protective layer 3, and the absorption layer 4 are formed on the one surface of the substrate. The absorption layer 4 is an absorption layer (monolayer) 4a ((a) of FIG. 18) or an absorption layer (lamination) 4b ((b) of FIG. 18). The conductive film 5 is formed on the opposite surface side of the multilayered reflective layer 2 of the substrate 1. The sacrificial film 12 is formed by forming a trench through etching of a light-shielding frame area A, and then through vapor deposition using plasma CVD, a sputtering method, or an ion plating method known in the art. A sputtering method known in the art can be used for forming the multilayered reflective layer 2, the protective layer 3, the absorption layer 4, and the conductive film 5.

The following is one example of respective components. The components may be changed as appropriate using technologies and materials known in the art for providing desired performance and properties to the reflective mask blank or the reflective mask.

The substrate 1 can be formed from a material containing quartz ($SiO_2$) as a main component and titanium oxide ($TiO_2$). In addition thereto, synthetic quartz, silicon, and metals can be used. For the substrate 1, a material with low thermal expansion is preferably used.

The following films (layers) can be formed using a vapor deposition method known in the art as described above.

The sacrificial film 12 can be formed with an aluminum (Al) film, or a nitride film (SiN) or an oxide film (SiO) whose main component is silicon (Si). The sacrificial film 12 can be formed by performing, in advance, wet etching with NaOH, CsOH, HF, KOH, or the like or dry etching with gas plasma using a fluorine-based gas on the substrate at any location that is to be intended as the light-shielding frame area on the substrate 1, and applying the above described materials thereto.

Having a film thickness smaller than 1 nm for the sacrificial film 12 is not preferable since film formation may become difficult. Having a thickness larger than 1.5 μm is not preferable from a standpoint of throughput, since time will be needed for lift-off. Therefore, the film thickness of the sacrificial film 12 is preferably 1 nm to 1.5 μm.

The multilayered reflective layer 2 can be formed from a multilayer structure obtained by alternately laminating (depositing), on the substrate, multiple layers of molybdenum (Mo) and silicon (Si) as materials.

The protective layer 3 may have a monolayer structure or a laminated structure formed on the multilayer reflective film, and can be formed with a material containing either ruthenium (Ru) or silicon (Si). When the protective layer 3 has a laminated structure, the uppermost layer may be formed on the monolayer structure described above with a material containing any one of an oxide, a nitride, or an oxynitride of ruthenium (Ru), or an oxide, a nitride, or an oxynitride of silicon (Si). A laminated structure can be formed by using a substance with a composition that is different from that of the monolayer structure (e.g., using Si oxide on the uppermost layer when the monolayer is Si nitride).

The absorption layer 4 has the monolayer structure (4a) or the laminated structure (4b) formed on the protective film, and is formed from a material containing any one of tantalum (Ta) and an oxide, a nitride, or an oxynitride thereof. When the absorption layer has the laminated structure, the uppermost layer thereof can be formed with a material containing any one of an oxide, a nitride, or an oxynitride of tantalum (Ta), or an oxide, a nitride, or an oxynitride of silicon (Si).

The conductive film 5 can be formed on the substrate face opposite of the multilayered reflective layer 2, with a material containing a metal of either chromium (Cr) or tantalum (Ta), or any one of an oxide, a nitride, or an oxynitride thereof.

The conductive film 5 can be used when performing chucking for fixing the reflective mask blank or the reflective mask. It is not always necessary to form the conductive film 5 when other fixing methods are used.

The light-shielding frame 11 can be formed by forming the reflective mask as described next on the reflective mask blank as described above.

Figure 19:
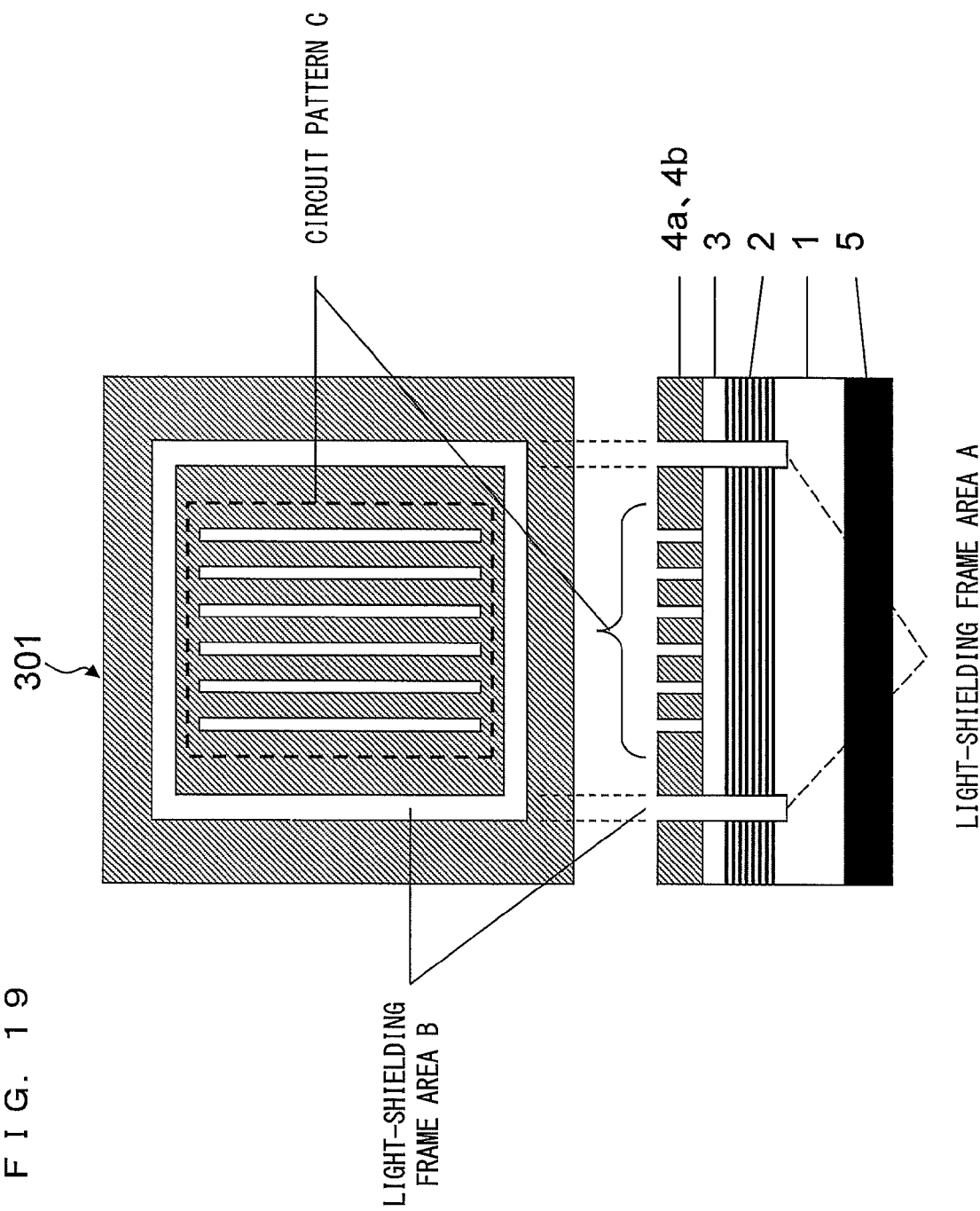
FIG. 19 includes a plan view for describing a reflective mask according to the third embodiment of the present invention.

Next, the method for manufacturing the mask of the present embodiment will be described. FIG. 19 shows a reflective mask 301 for exposure obtained using the reflective mask blank 300 shown in FIG. 18. The reflective mask 301 has a structure in which the absorption layer 4 and the protective layer 3 are formed on the outer side of a circuit pattern C, and a light-shielding frame area B is formed at one part of the multilayered reflective layer 2.

Figure 20:
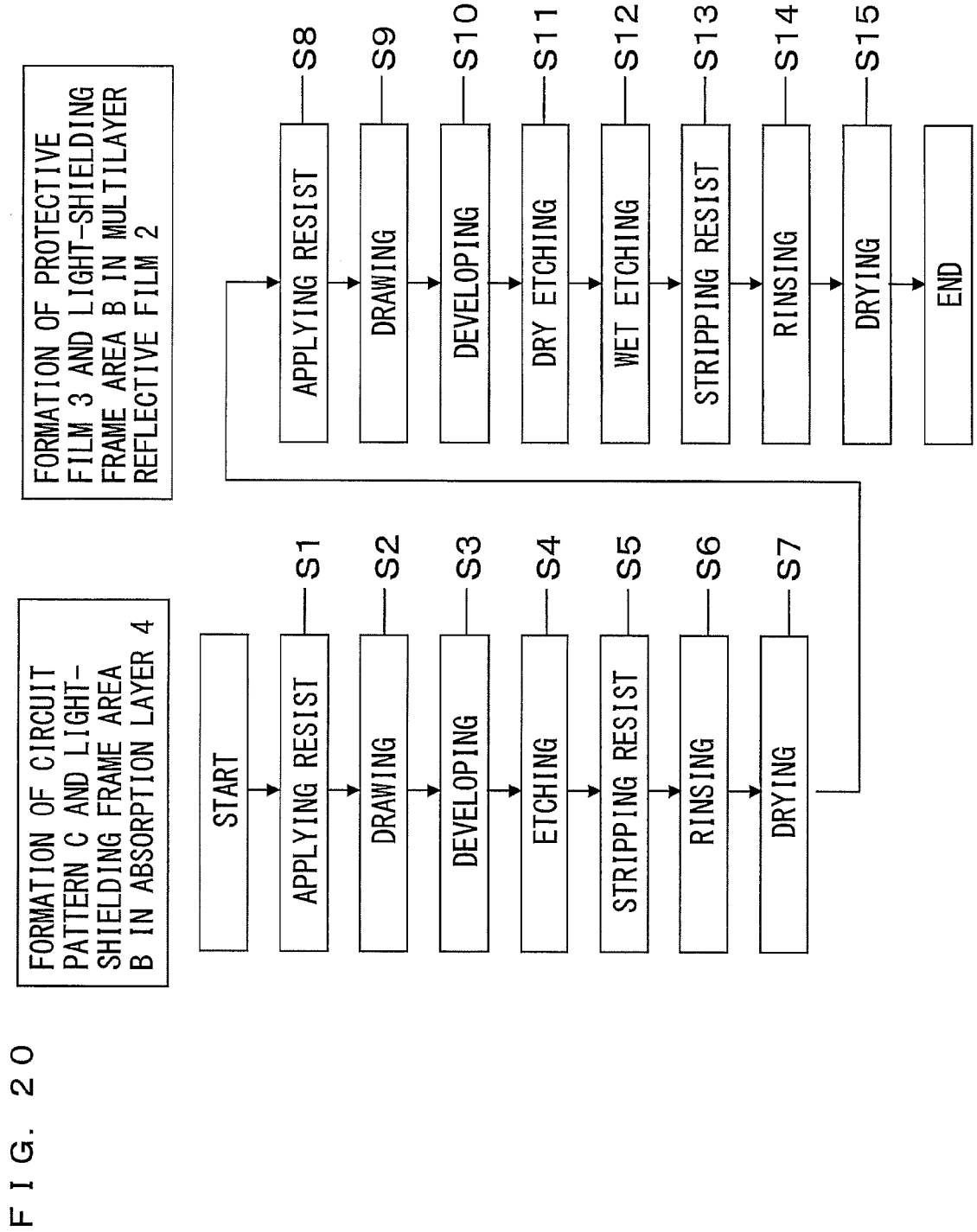
FIG. 20 is for describing a method for manufacturing a reflective mask according to the third embodiment of the present invention.
Figure 21:
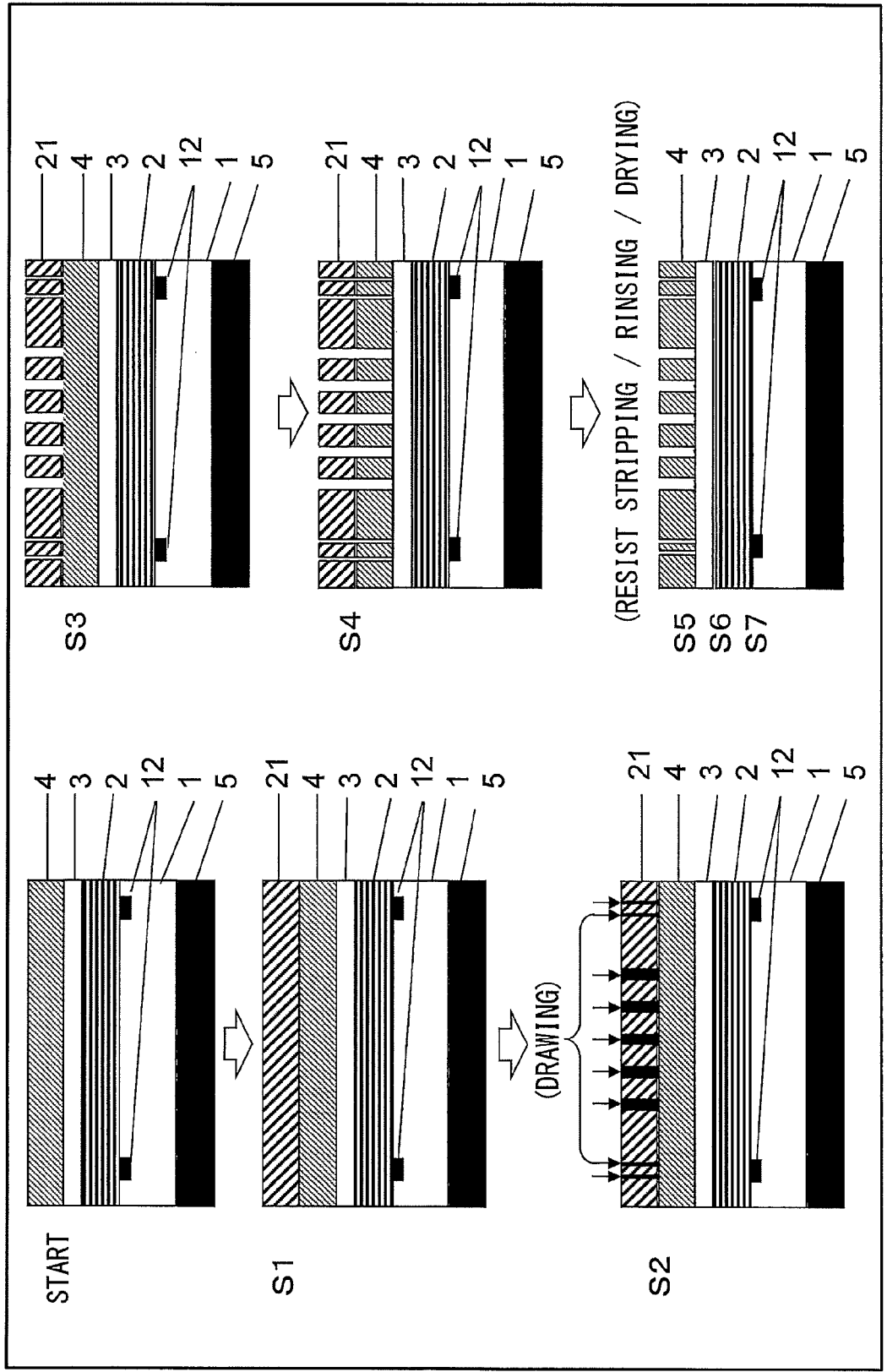
FIG. 21 includes cross sectional views showing an Example of the method for manufacturing the reflective mask according to the third embodiment of the present invention.
Figure 22:
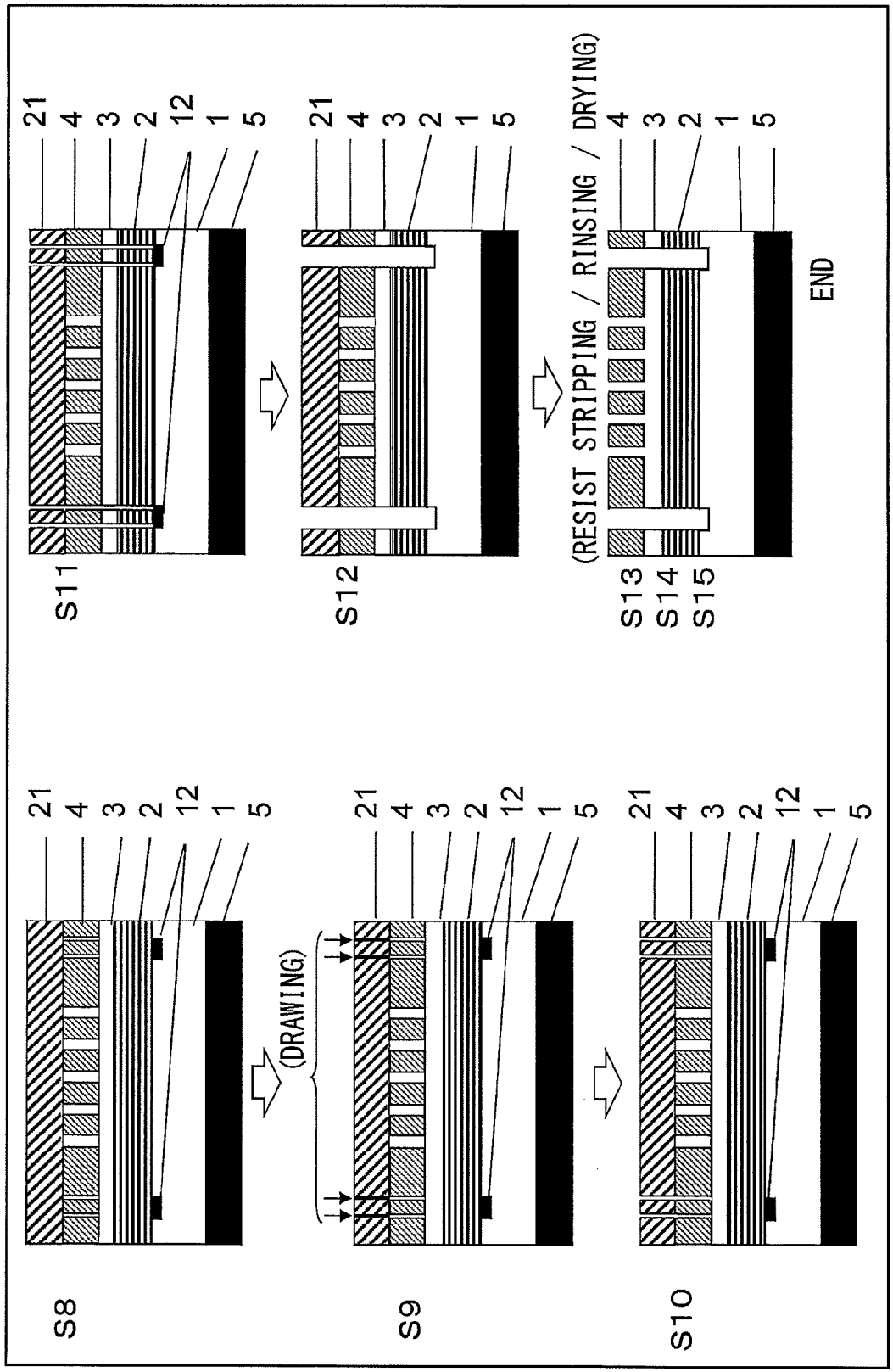
FIG. 22 includes cross sectional views showing an Example of the method for manufacturing the reflective mask according to the third embodiment of the present invention.

The method for manufacturing the reflective mask 301 for exposure is shown in FIG. 20 to FIG. 22. FIG. 20 shows the steps, and FIGS. 21 and 22 show cross sectional views of the processing states. First, the reflective mask blank 300 shown in FIG. 18 is prepared, and the light-shielding frame area B and circuit pattern C are formed on the absorption layer 4. Then, a chemically amplified or non-chemically amplified resist 21 that is reactive against electron beam is applied (S1), and the predetermined light-shielding frame area B and circuit pattern C are drawn (S2).

Then, developing (S3) is performed with an alkaline solution or the like, a pattern of the formed resist 21 is used as a mask and etching (S4) is performed with gas plasma using a fluorine-based gas or a chlorine-based gas, and unnecessary patterns of the resist 21 are decomposed through incineration with oxygen plasma or an oxidation chemical such as sulfuric acid and ozone water, or are dissolved and stripped (S5) using an organic solvent or the like.

Then, if necessary, a rinsing process (S6) using a surfactant, an organic alkaline chemical, or ultrapure water having dissolved therein an acidic or alkaline chemical, ozone gas, or hydrogen gas; and spin drying (S7) utilizing centrifugal force are performed. With the steps described above, the light-shielding frame area B and the circuit pattern C are formed.

Next, the parts of the multilayered reflective layer 2 and the protective layer 3 of the light-shielding frame area B are formed. The resist 21 that is reactive against ultraviolet ray or electron beam is applied (S8) on the mask. Next, the light-shielding frame area B is exposed or drawn (S9) with electron beam.

Developing (S10) and etching (S11) are performed similarly to (S3) and (S4) to form one part of the light-shielding frame. Next, the sacrificial film 12 is stripped by performing, on the formed dug-in trench, wet etching (S12) using an ammonium fluoride solution, a mixture of fluoric acid and nitric acid, phosphoric acid, or the like to lift off upper layers thereof including the multilayered reflective layer 2, the protective layer 3, the absorption layer 4, and resist 21.

Then, striping (S13), rinsing (S14), and drying (S15) of the resist 21 are performed to complete the light-shielding frame 11 in the light-shielding frame area B. In the etching step (S11), stripping of the protective layer 3 is performed using fluorine-based gas plasma, and stripping of the multilayered reflective layer 2 is performed with fluorine-based gas plasma similar to the protective layer 3 or with a method of alternately using chlorine gas based plasma.

With the step described above, the reflective mask 301 is completed.

In the present embodiment, to form the light-shielding frame, the sacrificial film is formed on the substrate. Next, when digging into the multilayered reflective layer, both sides of the light-shielding frame are each dry etched, and then the dug-in trench is filled with a wet etching liquid to strip the sacrificial film at the lower layer of the multilayered reflective layer and layers above thereof from the upper layer of the multilayered reflective layer up to the absorption layer are lifted off. As a result, it is possible to easily manufacture a reflective mask having high light-shielding ability without having the multilayered reflective layer remaining.

In the embodiments described above, although EUV light having a wavelength of 13.5 nm is used as one example of the exposure light, the present invention can be suitably applied with other wavelengths. For example, the resent invention can be suitably applied with exposure light having a wavelength of not shorter than 5 nm but not longer than 15 nm.

In addition, the above described embodiments can also be combined. For example, by suitably performing the etching process for the reflective mask of the second embodiment or the third embodiment, the opening width of the multilayered reflective layer can be made wider than the opening width of the absorption layer location above, similarly to the first embodiment.

INDUSTRIAL APPLICABILITY

The present invention is useful for reflective masks etc.

DESCRIPTION OF THE REFERENCE CHARACTERS 1 substrate
2 multilayered reflective layer
3 protective layer
4 absorption layer
5 conductive film
6 buffer layer
7 conductive film-stripped area
9, 21, 29 resist
10 pattern area, range
11 light-shielding frame
12 sacrificial film
20 EUV reflectance measuring point
80 absorption layer area
85 circuit pattern
90 frame-shaped area
100, 200, 300 reflective mask blank
101, 102, 103, 104, 201, 202, 203, 204, 205, 206, 207, 209, 210, 301, 901 reflective mask
901 EUV light reflected at absorption layer part
902 EUV light reflected inside light-shielding frame
903, 904 EUV light reflected at light-shielding frame edge part

What is claimed is:
1. A reflective mask comprising:
a substrate;
a multilayered reflective layer formed on one surface of the substrate;
a protective layer formed on the multilayered reflective layer; and
an absorption layer formed on the protective layer, wherein at least one part of an outer side of a circuit pattern area formed on the absorption layer has a light-shielding frame that is formed through stripping of the absorption layer, the protective layer, and the multilayered reflective layer, and an opening width of the multilayered reflective layer within the light-shielding frame is wider than an opening width of the absorption layer located above thereof.

2. The reflective mask according to claim 1, wherein the opening width of the multilayered reflective layer within the light-shielding frame is wider than the opening width of the absorption layer located above thereof, by not less than 21% of a film thickness of the multilayered reflective layer.

3. The reflective mask according to claim 1, wherein a shape of a lateral wall of the multilayered reflective layer within the light-shielding frame is a reverse tapered shape.

4. The reflective mask according to claim 1, wherein an angle of a lateral wall of the multilayered reflective layer within the light-shielding frame is not smaller than −6 degrees at which EUV light entering the mask does not directly enter a lateral wall of the multilayered reflective layer.

5. The reflective mask according to claim 1, wherein a conductive film is further formed on the other surface of the substrate at least at an area where the light-shielding frame is not formed.

6. A method for manufacturing a reflective mask, the method comprising:
forming a multilayered reflective layer on one surface of a substrate;
forming an absorption layer on the multilayered reflective layer;
forming a circuit pattern on the multilayered reflective layer; and
forming a light-shielding frame through stripping, with dry etching or wet etching, of the multilayered reflective layer and the absorption layer in a frame-shaped area on an outer side of the circuit pattern, until one surface of the substrate is exposed, such that an opening width of the multilayered reflective layer is wider than an opening width of the absorption layer located above thereof.

7. The method for manufacturing the reflective mask according to claim 6, the method further comprising, before the forming of the light-shielding frame, digging that is penetrating and stripping of the multilayered reflective layer within the light-shielding frame in advance.

8. The method for manufacturing of the reflective mask according to claim 6, wherein, at the forming of the light-shielding frame, dry etching is performed on the multilayered reflective layer with a usage of gas containing fluorine atoms.

9. The method for manufacturing the reflective mask according to claim 8, wherein the gas containing fluorine atoms is a gas containing at least any one of $CF_4$, $C_2F_6$, $C_4F_8$, $C_5F_8$, $CHF_3$, $SF_6$, and $ClF_3$.

10. The method for manufacturing the reflective mask according to claim 6, wherein, at the forming of the light-shielding frame, wet etching is performed on the multilayered reflective layer with a usage of an etching liquid containing at least any one of nitric acid, phosphoric acid, fluoric acid, sulfuric acid, and acetic acid.

11. The method for manufacturing the reflective mask according to claim 6, the method further comprising:
forming a conductive film on the other surface of the substrate; and
forming, at an area where the light-shielding frame is formed, a conductive film-stripped area in which the conductive film is stripped until the other surface of the substrate is exposed.

12. The method for manufacturing the reflective mask according to claim 11, wherein the forming of the light-shielding frame and the forming of the conductive film-stripped area are performed together by stripping the multilayered reflective layer, the absorption layer, and the conductive film through irradiation using, from one surface side or the other surface side of the substrate, laser light that is transmissive with respect to the substrate but is untransmissive with respect to the multilayered reflective layer, the absorption layer, and the conductive film.

13. The method for manufacturing the reflective mask according to claim 12, wherein the forming of the light-shielding frame and the forming of the conductive film-stripped area are performed before the forming of the circuit pattern.

14. The method for manufacturing the reflective mask according to claim 12, wherein the forming of the light-shielding frame and the forming of the conductive film-stripped area are performed after the forming of the circuit pattern.

15. The method for manufacturing the reflective mask according to claim 12, wherein, as the laser light, laser light generated by a YAG laser or a $CO_2$ laser is used.

16. The method for manufacturing the reflective mask according to claim 6, wherein,
- at the forming of the multilayered reflective layer on one surface of the substrate,
- a sacrificial film is formed with an Al film, or a nitride film (SiN) or an oxide film (SiO) whose main component is silicon (Si), on one part of the substrate formed with a material that contains quartz ($SiO_2$) as a main component, and titanium oxide ($TiO_2$), and,
- thereafter, the multilayered reflective layer that reflects exposure light is formed on the substrate in a multilayer structure having multiple layers of materials of molybdenum (Mo) and silicon (Si) layered alternately,
- at the forming of the absorption layer
- the absorption layer absorbing the exposure light is formed on the multilayered reflective layer, in a monolayer structure formed with a material containing any one of tantalum (Ta) and an oxide, a nitride, or an oxynitride thereof, or in a laminated structure in which a material containing any one of tantalum (Ta) and an oxide, a nitride, or an oxynitride thereof is laminated, and a material containing any one of an oxide, a nitride, an oxynitride of tantalum (Ta) or an oxide, a nitride, or an oxynitride of silicon (Si) is laminated on an uppermost layer, and
- at the forming of the light-shielding frame, the light-shielding frame is disposed on an area where the sacrificial film is formed.

17. The method for manufacturing the reflective mask according to claim 16, the method comprising
- forming a protective layer, configured to protect the multilayer reflective film, between the multilayer reflective film and the absorption film, in a monolayer structure formed with a material containing either one of ruthenium (Ru) or silicon (Si), or in a laminated structure in which a material containing either one of ruthenium (Ru) or silicon (Si) is laminated, and a material containing any one of an oxide, a nitride, or an oxynitride of ruthenium (Ru), or an oxide, a nitride, or an oxynitride of silicon (Si) is laminated as an uppermost layer, wherein
- at the forming of the light-shielding frame, the protective layer is stripped in the area where the sacrificial film is formed.

18. The method for manufacturing the reflective mask according to claim 16, the method further comprising
- forming, at least at an area where the light-shielding frame is not formed, a conductive film on a surface of the substrate opposite to the multilayer reflective film, with a material containing either one of chromium (Cr) or tantalum (Ta), or any one of an oxide, a nitride, or an oxynitride of chromium (Cr) or tantalum (Ta).

19. A reflective mask manufactured with the method for manufacturing the reflective mask according to claim 6.

* * * * *